US008948562B2

(12) United States Patent
Norris et al.

(10) Patent No.: US 8,948,562 B2
(45) Date of Patent: Feb. 3, 2015

(54) REPLICATION OF PATTERNED THIN-FILM STRUCTURES FOR USE IN PLASMONICS AND METAMATERIALS

(75) Inventors: David J. Norris, Zurich (CH); Sang Eon Han, Cambridge, MA (US); Aditya Bhan, Minneapolis, MN (US); Prashant Nagpal, Los Alamos, NM (US); Nathan Charles Lindquist, Vadnais Heights, MN (US); Sang-Hyun Oh, Plymouth, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 924 days.

(21) Appl. No.: 13/131,197

(22) PCT Filed: Nov. 24, 2009

(86) PCT No.: PCT/US2009/006255
§ 371 (c)(1),
(2), (4) Date: Nov. 4, 2011

(87) PCT Pub. No.: WO2010/065071
PCT Pub. Date: Jun. 10, 2010

(65) Prior Publication Data
US 2012/0161600 A1 Jun. 28, 2012

Related U.S. Application Data

(60) Provisional application No. 61/200,201, filed on Nov. 25, 2008, provisional application No. 61/142,316, filed on Jan. 2, 2009, provisional application No. 61/215,056, filed on May 1, 2009.

(51) Int. Cl.
*H01L 21/00* (2006.01)
*H01L 21/28* (2006.01)
(Continued)

(52) U.S. Cl.
CPC .............. *B81C 99/009* (2013.01); *B82Y 10/00* (2013.01); *B82Y 40/00* (2013.01); *G03F 7/0002* (2013.01)

USPC ................. 385/131; 438/34; 438/31; 438/32; 257/252; 257/E31.093; 385/12; 385/130; 216/54; 216/33; 356/445; 427/162; 249/14.11; 249/116; 428/614; 428/615; 428/617

(58) Field of Classification Search
USPC ............ 428/44, 46, 48, 195.1, 209, 214, 343, 428/344, 354, 355 R, 539.5, 614–617, 622, 428/686; 427/516, 162, 167, 545, 569, 570, 427/573–576; 249/114.1, 115, 116, 135; 264/1.24, 1.25, 1.27, 1.34, 1.36, 171.1, 264/171.14, 171.16, 171.17, 171.27; 385/4, 385/9, 12, 39, 129–131, 147; 257/252, 257/E31.093; 438/24, 28, 29, 31, 32, 34, 438/69, 71, 79
See application file for complete search history.

(56) References Cited

U.S. PATENT DOCUMENTS 6,139,626 A * 10/2000 Norris et al. ................... 428/323
6,523,804 B1 2/2003 Blom et al.
(Continued)

OTHER PUBLICATIONS

Kim et al., "Photoplastic near-field optical probe with sub-100 nm aperture made by replication from a nanomould," Journal of Microscopy, vol. 209, Pt. 3 Mar. 2003, pp. 267-271.
(Continued)

*Primary Examiner* — Bernard E Souw
(74) *Attorney, Agent, or Firm* — Kagan Binder, PLLC

(57) ABSTRACT

The present invention provides templating methods for replicating patterned metal films from a template substrate such as for use in plasmonic devices and metamaterials. Advantageously, the template substrate is reusable and can provide plural copies of the structure of the template substrate. Because high-quality substrates that are inherently smooth and flat are available, patterned metal films in accordance with the present invention can advantageously provide surfaces that replicate the surface characteristics of the template substrate both in the patterned regions and in the unpatterned regions.

9 Claims, 24 Drawing Sheets

(51) Int. Cl.
*H01L 51/50* (2006.01)
*H01L 51/52* (2006.01)
*B81C 99/00* (2010.01)
*B82Y 10/00* (2011.01)
*B82Y 40/00* (2011.01)
*G03F 7/00* (2006.01)

(56) References Cited

U.S. PATENT DOCUMENTS

| | | | |
|---|---|---|---|
| 6,805,809 B2 | 10/2004 | Nuzzo et al. | |
| 7,728,366 B2 * | 6/2010 | Oohashi et al. | 257/292 |
| 7,883,911 B2 * | 2/2011 | Oohashi et al. | 438/24 |
| 7,989,254 B2 * | 8/2011 | Yoon | 438/70 |
| 2003/0219992 A1 | 11/2003 | Schaper | |
| 2006/0006580 A1 | 1/2006 | Olsson et al. | |
| 2008/0190888 A1 | 8/2008 | Heejoon et al. | |
| 2008/0292852 A1 * | 11/2008 | En et al. | 428/209 |
| 2011/0116094 A1 * | 5/2011 | Allsop et al. | 356/445 |
| 2012/0165759 A1 * | 6/2012 | Rogers et al. | 604/264 |
| 2012/0235067 A1 * | 9/2012 | Araci et al. | 250/504 R |
| 2013/0087194 A1 * | 4/2013 | Jang et al. | 136/258 |
| 2014/0036369 A1 * | 2/2014 | Ushinsky et al. | 359/585 |
| 2014/0151678 A1 * | 6/2014 | Sakuma et al. | 257/40 |

OTHER PUBLICATIONS

Sun et al., "Templated fabrication of Periodic Metallic Nanopyramid Arrays," Chem. Mater. 2007, 19, 4551-4556.

* cited by examiner

REPLICATION OF PATTERNED THIN-FILM STRUCTURES FOR USE IN PLASMONICS AND METAMATERIALS

CROSS REFERENCE TO RELATED APPLICATIONS

This application claims the benefit of International Application No. PCT/US2009/006255, which in turn claims priority to U.S. Provisional Application No. 61/200,201, filed Nov. 25, 2008, U.S. Provisional Application No. 61/142,316, filed Jan. 2, 2009, and U.S. Provisional Application No. 61/215,056, filed May 1, 2009, the disclosures of which are incorporated herein by reference in their entireties and for all purposes.

This work was supported by the U.S. Department of Energy (DE-FG02-06ER46438) and was also funded by NSF through the NNIN program and was also funded by an NIH Biotechnology Training Grant (T32-GM008347). The US Government may have certain rights to the invention.

TECHNICAL FIELD

The present invention relates generally to patterned devices and methods of making such devices. More particularly, the present invention relates to thin film structures comprising metal films replicated from a patterned template substrate and methods of making such structures such as for use in plasmonic devices and metamaterials.

BACKGROUND

Surface plasmons are electromagnetic surface waves confined to a metal-dielectric interface by coupling to the free electron plasma in metals. Due to their evanescent nature, surface plasmon waves are not limited by the diffraction limit, and can provide confinement of light on scales much smaller than the free-space wavelength. The possibility of subwavelength confinement and control of optical fields has generated intense interest in the rapidly developing field of plasmonics and plasmonic devices.

Because the surface plasmons allow light to be concentrated in nanometer-scale volumes, surface plasmons have many applications including bio-sensing, data storage, photonics, and solar cells, for example. Traditionally, plasmonics has been utilized in spectroscopic techniques such as surface enhanced raman spectroscopy, where intense local fields allow the detection of single molecules. More recently, the ability to couple light to surface plasmons has been examined for reducing optical circuit elements such as waveguides, filters, switches for example, to sizes much smaller than the optical wavelength. As a result, the field of plasmonics has arisen to study how man-made metallic structures can control the generation, propagation, and manipulation of surface plasmons.

One observation that has spurred this development is the enhanced optical transmission through thin metal films that are perforated with an array of sub-wavelength holes. Because the holes are periodically spaced, diffraction can excite surface plasmons when the film is irradiated. The surface plasmons can then transmit energy through the holes and re-radiate on the opposite side of the film. This leads to (i) transmission much higher than would be expected for sub-wavelength holes and (ii) electric fields that are highly concentrated within the holes. More recently, the same effects were observed when a single hole in a metal film was surrounded by circular concentric grooves patterned on both sides of the film. See Lezec, H. J.; Degiron, A.; Devaux, E.; Linke, R. A.; Martin-Moreno, L.; Garcia-Vidal, F. J. and Ebbesen, T. W.; "Beaming light from a subwavelength aperture," Science 297, 820 (2002). In this case, the surface plasmons interact with the quasiperiodicity of the structure to couple to the far field. Furthermore, even with a sub-wavelength hole, the transmitted beam is highly directional, a property useful for many applications.

Since the discovery of these effects and others, many researchers have begun incorporating these phenomena into plasmonic devices. Typically an optical signal is utilized to create the surface plasmons. Once formed, they can then be manipulated on the device before re-radiating as an optical output. However, in many cases it may be more convenient to have a non-optical source for surface plasmons on the device.

In many devices, surface plasmons are created when a metal film, such as silver or gold, is illuminated on an exposed surface of the metal film. Although this excitation process is theoretically forbidden when the surface is perfectly flat, surface patterning on a sub-optical length scale (micrometers or nanometers, for example) allows incident light to generate plasmons in the metal film. Patterning also provides a means to manipulate such plasmons once the plasmons are created. Because the plasmons exist very close to the surface of the metal film, the plasmons are sensitive to surface inhomogeneities, which can cause one or more of absorption, scattering, and limited propagation, for example.

Several methods are known for fabricating patterned metal surfaces with features on a sub-micrometer or nanometer length scale. For example, in one method a metal film is deposited on a surface of a substrate such as by using thermal evaporation or sputtering. After depositions the metal film is patterned to have sub-optical length scale features by conventional lithography steps such as by using photolithography or e-beam lithography, for example. Alternatively, after deposition, focused ion beam etching is used to pattern the metal film. Using either approach, sub-micrometer features can be formed in the metal film.

Methods for forming patterned metal surfaces having sub-optical length scale features, such as the deposition methods described above, have several shortcomings. For example, one limitation relates to surface roughness. As noted above, plasmons are sensitive to surface inhomogeneities, thus it is desirable for the surfaces of the metal film to be smooth and free from undesirable surface inhomogeneities. Such smooth surfaces are desired both in the patterned regions and the unpatterned regions. This is because surface plasmons can be scattered during propagation across a metal surface by such roughness leading to potential losses and undesirable performance.

Using the methods described above, the surfaces of the metal film in the patterned regions are typically rough for several reasons. Generally, roughness of the surfaces of the metal film in the patterned regions is undesirable. After deposition, metallic films are typically polycrystalline. That is, the metal includes many individual small grains of crystal that are randomly oriented in space. Patterning by conventional techniques such as reactive ion etching or focused ion beam etching exposes each of the individual metallic grains differently due to anisotropic etching in the material. This leads to roughness of the surfaces in the patterned regions after the patterning operation.

The surfaces of the unpatterned regions are also typically rough for several reasons. Generally, roughness of the surfaces of the unpatterned regions is also undesirable. In particular, the surfaces of the metal film in the unpatterned regions are usually rough due to the presence of the grains themselves. In other words, deposited metallic films have inherent surface roughness that is present even before the metal films are patterned. In any event, such surface roughness, whether in the patterned regions, unpatterned regions, or both, often causes losses and undesirable performance.

Another limitation of known methods for forming patterned metal surfaces, such as the deposition methods described above, is that such methods are not generally applicable to all metals. In particular, known methods for forming patterned metal surfaces are difficult to apply to high melting temperature refractory metals, such as tungsten, molybdenum, tantalum, and niobium. This difficulty arises because two major classes of patterning techniques, (i) imprinting, embossing, or molding, and (ii) lithography (patterning a thin film with a sacrificial pattern followed by etching), are not easily applicable to refractory metals. The first class of techniques (imprinting, embossing, or molding) is commonly used in the fabrication of compact discs and diffraction gratings. Patterning a refractory metal with these techniques is difficult because it would require heating the metal to an extremely high temperature where the metal softens. Further, these materials have inherent hardness and toughness, which causes wear on the molds. Typical molds used for embossing, such as silicon hard molds, would also not survive the high operating temperatures required to pattern these materials. The second class of fabrication techniques, lithography (etching with a mask), suffers from contamination and cost issues as well as limitations on the roughness and scale of the resultant pattern. In addition, with such a technique, etching recipes must be determined for each refractory material, some of which are not available. Both classes of techniques are also difficult to apply to metals with good wear resistance such as titanium. The difficulty arises not only from hardness but also because they typically etch slowly, which limits the use of sacrificial masks in lithography.

Additional known methods for fabricating patterned metal surfaces include nanoimprinting and nanomolding. Although nanoimprinting and nanomolding can pattern metals on the proper length scales, undesirable surface roughness is usually present in metal surfaces formed by nanoimprinting and nanomolding. In a typical process, a patterned polymeric mold is filled with metal to form a replica. This produces undesirable surface roughness because metals do not easily wet the surfaces of the polymeric mold. Moreover, an additional shortcoming of nanoimprinting and nanomolding is that the polymeric mold needs to be etched away from the metal film to release the metal film. Accordingly, each mold can only be used once to produce a single metal film.

Another technique that can be used to fabricate smooth metal surfaces is generally referred to as template stripping. Template stripping, utilizes the poor adhesion and good wettability of noble metals on solids such as mica, glass, and silicon. In a typical template stripping process, a freshly cleaved mica surface is coated with a film of gold. The exposed surface of gold is then attached to another substrate with an epoxy adhesive. When the mica and substrate are separated the gold adheres to the substrate by the epoxy and is released by the mica surface. The resulting gold surface typically has a roughness related to the roughness of the mica surface.

The above-described template stripping method, however, is limited to use with generally flat surfaces and has not successfully been utilized with surfaces including three-dimensional features such as those typically found on patterned metal films. This is because the addition of three-dimensional features generally increases the area of mica in contact with gold. As this contact area increases it becomes more difficult to separate the gold film from the mica surface. Moreover, such three-dimensional features can interfere with separation of the gold from the three-dimensional surface features. Where a patterned metal having three-dimensional features is desired, the above nanoimprinting and nanomolding techniques are typically used wherein the mold is etched away from the metal film.

SUMMARY

The present invention thus provides templating methods for replicating patterned metal films from a template substrate for use in plasmonic devices and metamaterials. Advantageously, the template substrate is reusable and can provide plural copies of the structure of the template substrate. Moreover, because high-quality substrates that are inherently smooth and flat are available, patterned metal films in accordance with the present invention can advantageously provide surfaces that replicate the surface characteristics of the template substrate both in the patterned regions and in the unpatterned regions.

Replication methods in accordance with the present invention can be combined with silicon microfabrication methods to create smooth patterned metals for plasmonics and metamaterials. The present invention provides methods to fabricate integrated metallic multilayer structures with designed surface features such as grooves, bumps, tips, and holes, for example, with controlled spacing and orientations, while simultaneously avoiding previous problems due to roughness and impurities.

The present invention also advantageously allows the polycrystalline nature of a metal film to be modified. For example, the grain sizes in a metal film can be increased without increasing the surface roughness in the film. Larger grain sizes can be important because this can decrease the resistivity of the metal and properties that are affected by the resistivity, such as the surface plasmon propagation length. The orientation of the grains can also be made more uniform. This allows metal films to be made that have a particular crystalline plane or a small collection of crystalline planes that are exposed. Because the crystalline plane exposed determines the arrangement of atoms on the surface, this can advantageously control the chemical and physical properties of the surface.

The present invention also provides methods to form patterned metal films that are single crystal. Accordingly, the present invention can overcome problems related to polycrystalline materials.

In one aspect of the present invention methods for replicating noble metals films and refractory metal films are provided. Advantageously, methods for replicating films of other classes of materials such as semiconductors and dielectrics are provided. Therefore, multilayered patterned films that contain several different material types, including metals are possible.

In another aspect of the present invention ultrasharp tips (with radii of curvature comparable or less than 10 nanometers) are provided. These tips can be placed at specific points on a patterned surface. They can include noble metals like silver, gold, or copper as well as refractory metals, semiconductors, and oxides, for example. When such tips are made from metals, the tips can utilize plasmonic or other optical effects to concentrate light in small volumes. This effect is useful for sensing, imaging, and other applications that utilize light intensity.

The present invention also provides plasmonic devices. In particular, the present invention advantageously demonstrates how to create a laser-like beam by heating a patterned metal film. To produce such a beam usually requires a laser cavity, which is more complex in design and is typically restricted to a very narrow range of operating wavelengths. The present invention can produce beams at wavelengths from microwaves to the visible. Related to other thermal emission control structures, the present invention produces a beam that is narrow both in spectral and angular distribution.

In an aspect of the present invention emission from metallic films with surfaces that are patterned with a series of circular concentric grooves are provided. Due to thermal excitation of surface plasmons, a single beam of light can be emitted from these films in the normal direction that is narrow, both in terms of spectrum and angular divergence.

Because plasmonic devices can be small, very low power is usually sufficient. Through proper design, the resulting surface plasmons can be launched with specific properties. Additional flexibility and new phenomena could result. This allows additional flexibility in design and can lead to useful phenomena.

In the field of plasmonics and metamaterials, many devices are possible in accordance with the present invention. Because the methods of the present invention can provide patterned single-layer or multi-layer films that are smooth and free from impurities, devices in accordance with the present invention have inherent advantages to devices made by any current fabrication strategy.

In addition to plasmonic devices, methods in accordance with the present invention can also create a variety of metamaterials. In particular, optical metamaterials often utilize alternating thin layers of different materials such as silver and alumina, for example. Methods in accordance with the present invention can produce such multi-layered films, as described and demonstrated herein.

BRIEF DESCRIPTION OF THE DRAWINGS

The accompanying drawings, which are incorporated in and constitute a part of this disclosure, illustrate several aspects of the present invention and together with description of the exemplary embodiments serve to explain the principles of the present invention. A brief description of the drawings is as follows.

DETAILED DESCRIPTION

The exemplary embodiments of the present invention described herein are not intended to be exhaustive or to limit the present invention to the precise forms disclosed in the following detailed description. Rather the exemplary embodiments described herein are chosen and described so those skilled in the art can appreciate and understand the principles and practices of the present invention.

Figure 1:
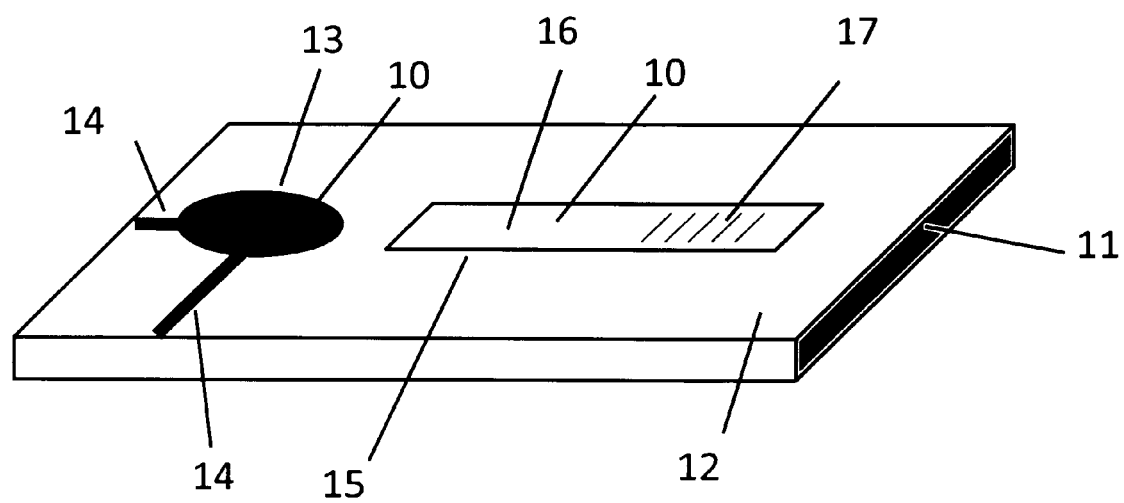
FIG. 1 is a schematic view of an exemplary plasmon device in accordance with the present invention.

An aspect of the present invention relates to the creation of surface plasmons with heat. This is useful in plasmonic devices for many applications, including sensing and optical signal processing. An exemplary embodiment of a plasmonic device in accordance with the present invention is shown schematically in FIG. 1. As shown, metal film 10 in accordance with the present invention is provided on substrate 11 where some of film 10 has been removed to expose surface 12 of substrate 11. Metal film 10 can be designed to create, manipulate, and/or extract surface plasmons in a specific way with heat. For example, metal pad 13 can comprise a smooth top surface that can act as a resonator for surface plasmons. When heated, such as by electrical current applied through electrical contacts 14, pad 13 can create surface plasmons with specific properties determined by the size, shape, and material of pad 13.

Surface plasmons can propagate in the surface of a patterned metal film. For example, patterned metal region 15 can be positioned next to pad 13 to collect and channel surface plasmons in a specific direction. In this way, region 15 effectively functions as a waveguide. Along metal region 15, region 16 can be used to modify surface plasmons. For example, if molecules were bound to region 16, this can effect the propagation of surface plasmons in a desirable way for sensing applications. Then at the end of the waveguide, a series of grooves 17 can couple surface plasmons into an optical beam that can function as an output signal. The shape and spacing of grooves 17 determine the wavelength and properties of this beam.

Figure 2:
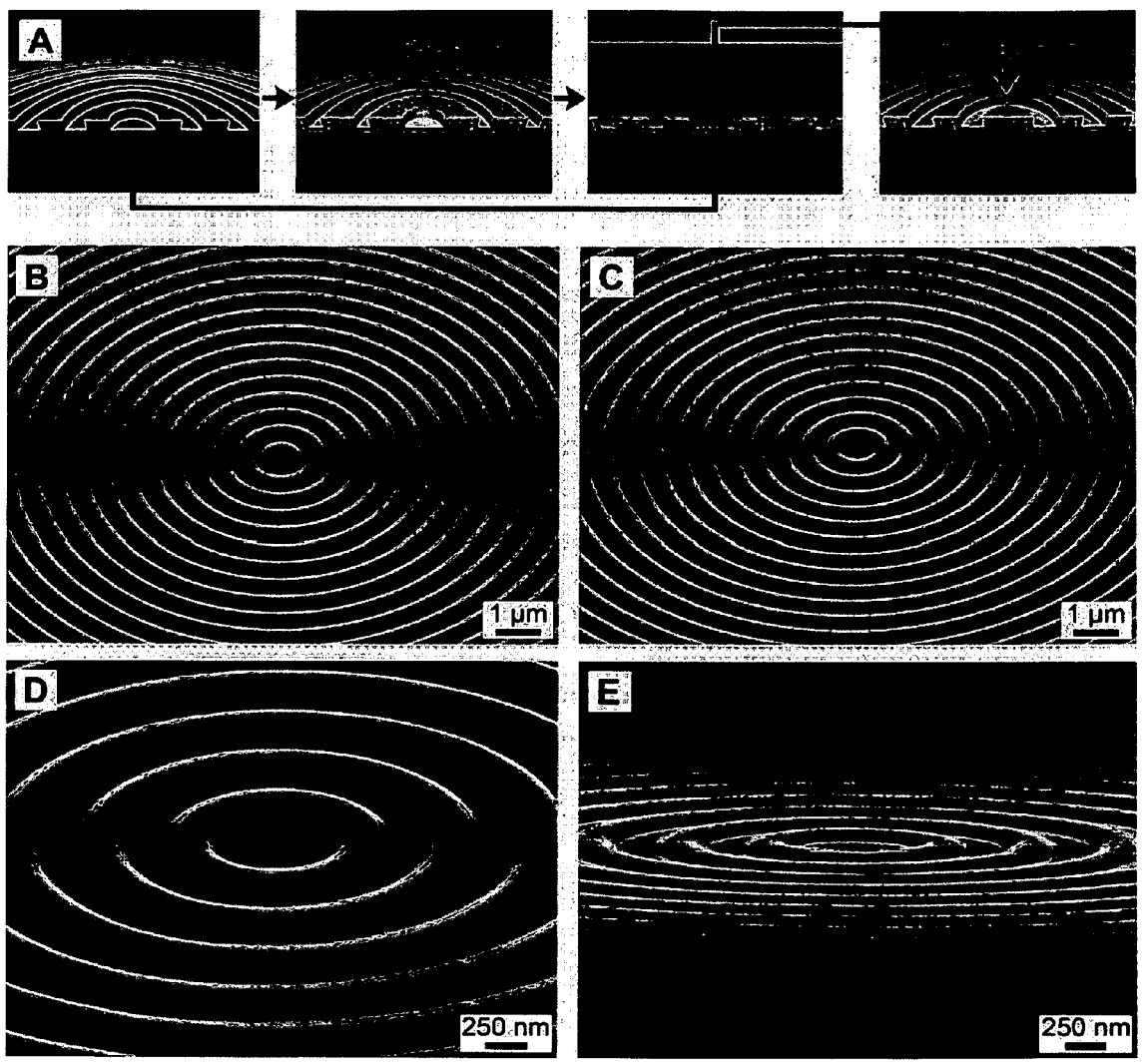
FIGS. 2A-E are electron micrographs of an exemplary concentric ring structure in accordance with the present invention.

FIG. 2 shows an exemplary structure comprising a metal film replicated from a patterned template substrate in accordance with the present invention and is discussed in further detail below. The illustrated structure comprises a silver film having concentric grooves that provide a concentric ring structure. Any desired metal can be used however. It is noted that the surface can be patterned using optical lithography. The structure shown in FIG. 2 is similar to the conventional structure shown in Lezec et al. as noted above except the central hole is not present and the metal film is patterned on only one side. When the patterned surface comprises a metal such as tungsten, for example, and is heated, the surface emits light when surface plasmons are thermally populated and then couple to the far-field via the grooves. The concentric ring structure can be heated by various means, including resistive heating by sending electrical current through the metal film and convective heating by heating the surrounding medium or an underlying substrate. Alternatively, the concentric ring structure can be heated by a chemical or nuclear reaction, by absorbing heat from the sun or other radiative source, or through friction. The method of heating is not critical to the desirable properties of the emission and any suitable heating method can be used.

Related optical behavior has been observed in linear gratings. However, compared to the linear gratings, the quasiperiodicity of the concentric ring structure of the present invention improves the properties of the output. Because the linear grating is periodic in one dimension, the emission does not form a beam normal to the surface. Rather, two curved emission lines fan out from the surface as momentum conservation can be satisfied by a range of specific output directions. In contrast, the concentric ring structure of the present invention emits a distinct beam normal to the surface. This can be understood by realizing that far from the center, each location within the concentric ring structure will behave as a linear grating and emit in a range of directions. However, because the grooves are oriented differently due to the quasiperiodicity, the only common emission direction for all locations is normal to the surface. Other directions are weak. A beam of thermal emission that is narrow both in spectral and angular distribution can be provided in accordance with the present invention.

This qualitative argument has been confirmed by theoretical calculations for a tungsten concentric ring structure with a groove periodicity of 3.5 micrometers. When the diameter of the structure is much larger than the plasmon propagation length, the plasmons can be approximated as infinitely large. In this case, the properties of the entire structure can be constructed from a combination of many linear gratings oriented around the circle. In other words, the contribution of the central region can be neglected.

Figure 3:
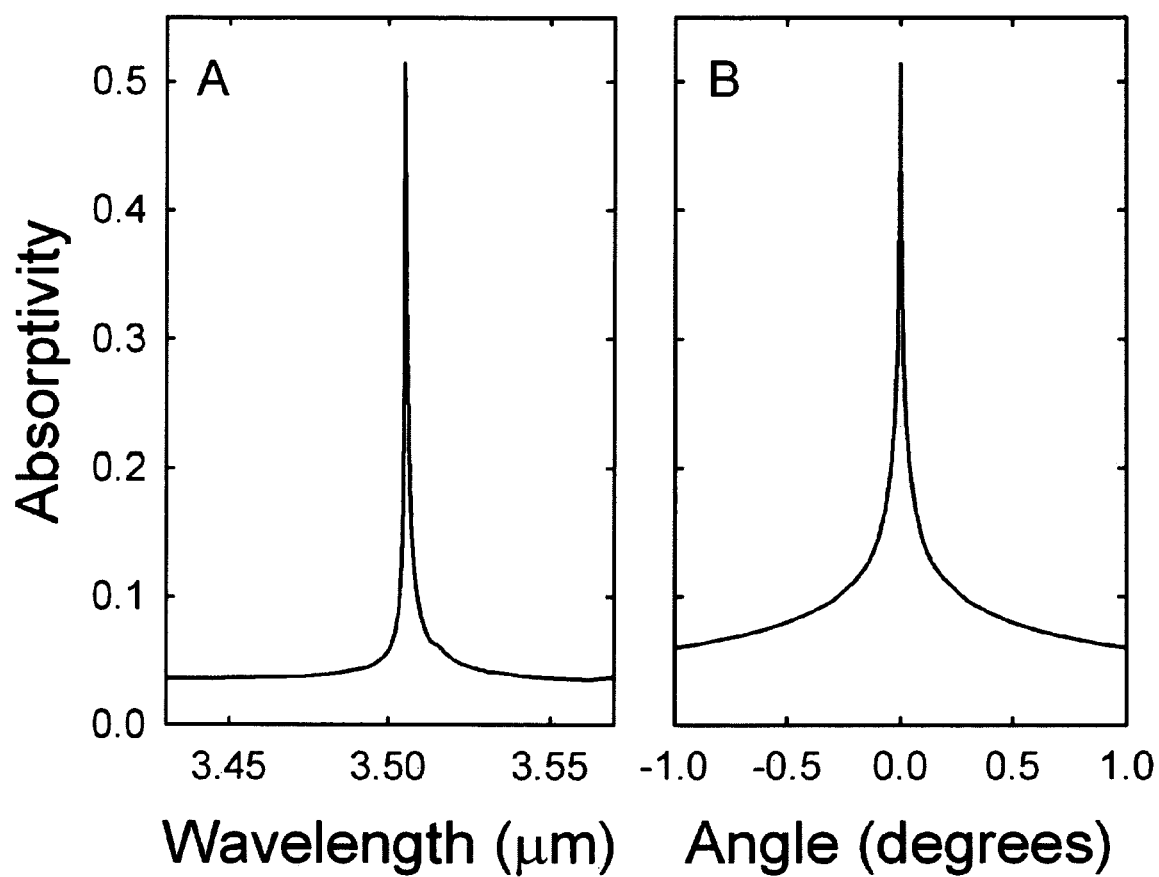
FIG. 3A is a graph showing the absorptivity spectrum for light impinging in the normal direction for an exemplary concentric ring structure similar to the structure shown in FIGS. 2A-D and comprising a tungsten metal film.
FIG. 3B is a graph showing the angular dependence of the absorption peak in degrees from normal incidence for an exemplary concentric ring structure similar to the structure shown in FIGS. 2A-D and comprising a tungsten metal film.

Because we can calculate the properties of a linear metallic grating using the transfer matrix method, this result can be utilized to integrate around the concentric ring structure. FIG. 3 shows such a calculation where the published dielectric function of tungsten was used. The absorptivity vs. both wavelength and angle are shown for a structure similar to that in FIG. 2 where tungsten is used. Because Kirchhoff's law states that absorptivity is directly related to emissivity, these plots also describe the thermal emission properties. These results confirm the qualitative argument that a beam of thermal emission narrow both in spectrum and angle can be produced. This model predicts that the emission for the concentric ring structure with a groove periodicity of 3.5 micrometers has spectral and angular linewidths of about 1 nm and about 0.02 degrees respectively. Further, results also predict that this effect is not limited to tungsten, but will also occur in other refractory metals such as tantalum and even silver. With optimization of the groove depth and width, desired linewidths can be provided in accordance with the present invention.

Prior work has considered the ability of patterned surfaces or periodically structured solids to modify the emissivity of a material. Most efforts have aimed to obtain emission features that are sharper than the broad black-body-like spectrum expected for unstructured solids. Indeed, narrow spectra have been reported, particularly for simple surface gratings. For example, one-dimensionally periodic grooves in a metal film can lead to a sharp emission peak. However, the wavelength of emission depends on the propagation direction of the emission. Thus, the angle-integrated spectrum is neither narrow nor directional. Highly directional monochromatic beams of thermal emission have not been obtained.

To show how if a concentric ring structure can provide such a beam, an exemplary theoretical examination is set forth below. This can be helpful because, as seen in simple gratings, the exact structure of the grooves can strongly influence the emission properties. However, because the concentric ring structure lacks translational symmetry, standard techniques for electromagnetic simulations of periodic structures are inefficient. Thus, such techniques have only been applied to concentric ring with a small number of circular grooves. For a more thorough study, it is assumed that structures are larger than the surface plasmon coherence length. In this case, contributions from the boundary and center of the structure can be neglected and the structure can be approximated with a series of linear gratings oriented around the center. The optical properties can then be determined by averaging the response of linear gratings evenly distributed in all directions in the plane. Specifically, the absorptivity is averaged, as absorptivity is equivalent to emissivity according to Kirchhoff's law.

Figure 4:
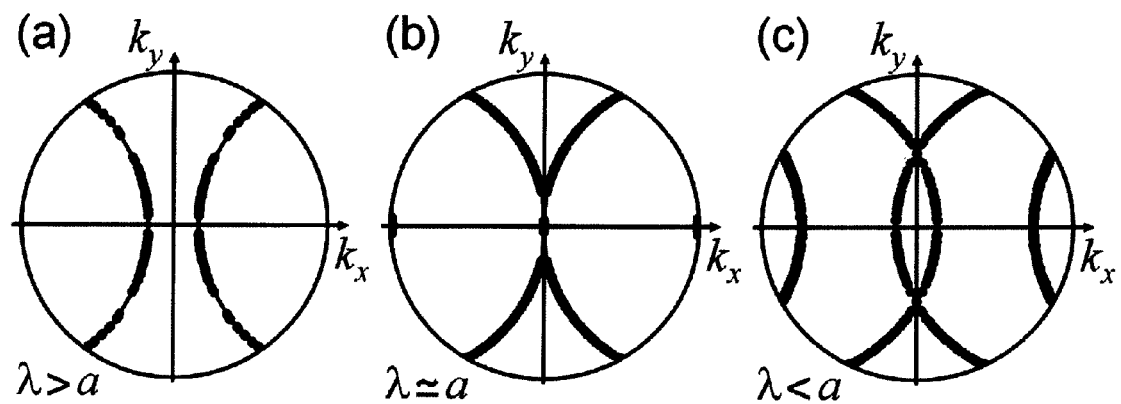
FIGS. 4a-c are graphs showing calculated in-plane wavevectors for which unpolarized light is absorbed for a tungsten one-dimensionally periodic linear grating.
Figure 5:
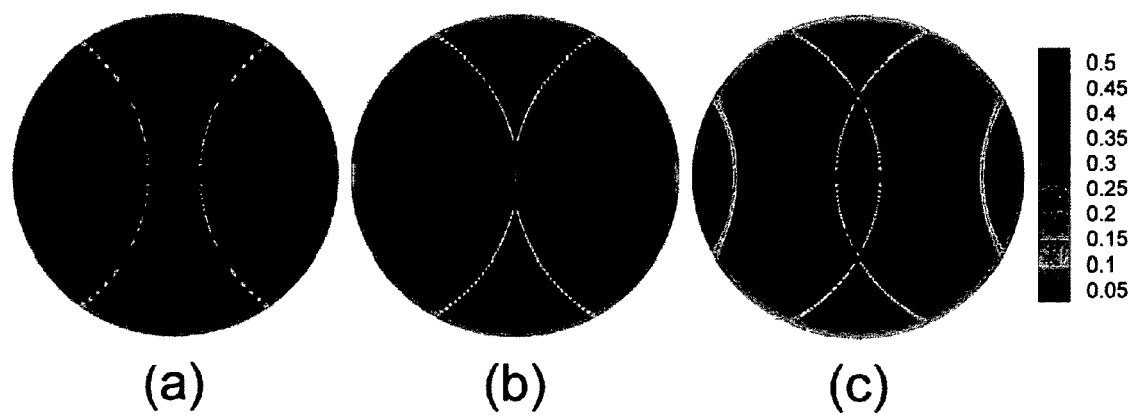
FIGS. 5a-c are contour plots showing calculated absorptivity versus in-plane wavevectors for unpolarized light impinging on a tungsten one-dimensionally periodic linear grating.

FIG. 4 plots the in-plane wavevectors for which absorption will occur for a one-dimensional tungsten grating and FIG. 5 shows contour plots of the actual absorptivity. The grating is ruled along y and periodic in x with period $\alpha=3.5$ µm. Absorption will occur when the incident light satisfies the momentum matching condition for coupling to surface plasmons, that is, when the incident light gains just enough parallel momentum from the grating to propagate parallel to the surface. The curves in FIG. 4 show when this condition is satisfied. When shifted by an integer multiple of the reciprocal lattice vector of the grating ($2\pi/\alpha$), these curves lie on the circular boundary of the plot. The boundary represents light with $k_\parallel=2\pi/\lambda$, where $k_\parallel$ is the wavevector parallel to the xy-plane and $\lambda$ is the optical wavelength. Three cases are shown in FIG. 4: (a) $\lambda>\alpha$, (b) $\lambda\cong\alpha$, and (c) $\lambda<\alpha$. When $\lambda$ is very close to $\alpha$, the plot has two dots at $k_x=\pm 2\pi/\alpha$ and two arcs meeting at the origin.

Using absorptivity vs. wavevector plots for one-dimensional gratings, the absorptivity due to surface plasmons for large concentric ring structures can be determined by averaging around a circle with radius $k_\parallel=(k_x^2+k_y^2)^{1/2}$. Because $k_\parallel$ can be converted to an angle $\theta$ from the surface normal through $k_\parallel=2\pi\sin\theta/\lambda$, the angular dependence of the absorptivity can be extracted by considering a series of $k_\parallel$ circles that increase in radius from zero to the plot boundary. From FIG. 4 shows that for $\lambda>\alpha$ and $\lambda<\alpha$ the absorptivity will be negligible when the $k_\parallel$ circle is very near the origin as no absorption curves exist there. As $k_\parallel$ increases, the circle will eventually intersect the curves that lie closest to the origin. This will lead to a feature in the absorptivity at a given $\theta$. However, because we average around the entire circumference of the $k_\parallel$ circle, such a feature will be weak. Further, such a feature should become weaker as the $k_\parallel$ circle increases in radius. This would also be required for any finite size source. Similarly, because the first intersection between the circle and the absorption curve moves away from the origin as $\lambda$ diverges from $\alpha$, the contribution to the absorptivity will also decrease away from the $\lambda\cong\alpha$ resonance condition. For the special case of resonance show in FIG. 4b, the two absorption curves cross at the origin. Thus, averaging over a very small $k_\parallel$ circle near the origin leads to a large contribution to the absorptivity. Consequently, on resonance the concentric ring structure exhibits an intense peak near $\theta=0$ and will be small otherwise. This qualitative analysis shows that the absorptivity due to surface plasmons in the concentric ring structure will decrease as: (i) $\theta$ increases and (ii) $\lambda$ diverges from $\alpha$. Moreover, a sharp absorption peak is observed when the surface is illuminated near normal incidence at $\lambda\approx\alpha$. Due to Kirchhoff's law, this shows a highly directional monochromatic beam will be emitted in the normal direction when the metal film is heated. The maximum intensity of this beam will be approximately half that of a black body at the same temperature because surface plasmons couple only to p-polarized light. It is also noted that this beaming behavior arises from the circular structure and does not occur in linear gratings.

Figure 6:
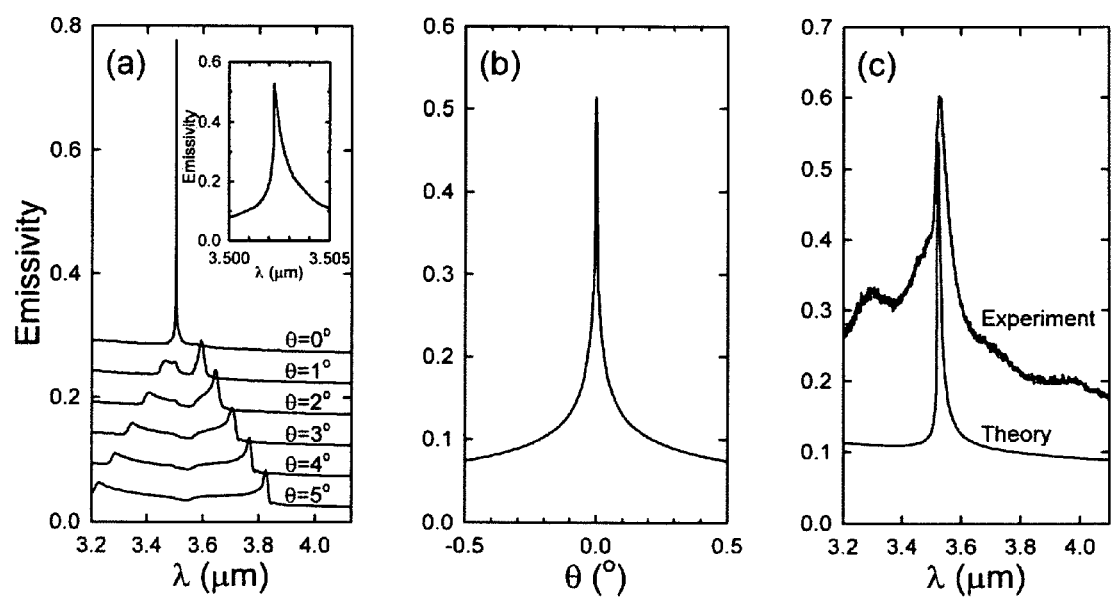
FIG. 6a is a graph showing calculated emissivity spectra at various angles from the surface normal for an exemplary tungsten concentric ring structure in accordance with the present invention.
FIG. 6b is a graph showing angular dependence of the emissivity at the peak wavelength for an exemplary tungsten concentric ring structure in accordance with the present invention.
FIG. 6c is a graph showing the measured and calculated emissivity spectrum for an exemplary tungsten concentric ring structure in accordance with the present invention.

Following this approach, the expected emissivity for exemplary large tungsten concentric ring structure with $\alpha=3.5$ µm is calculated. The width and depth of the rectangular-shaped grooves are varied to minimize the spectral width of the emission feature while keeping the emissivity above 0.5. The groove depth is restrictive to be less than 250 nm to be consistent with available fabrication techniques but larger groove depth can be used in accordance with the present invention. Exemplary grooves comprise a rectangular cross-section, have a depth of about 165 nm, and width of about 2.625 µm. By averaging over FIG. 5 spectra for this exemplary structure is obtained for various angles, as shown in FIG. 6a. As predicted, the calculated emissivity for $\theta\ne 0$ exhibits weak features both above and below $\lambda=\alpha$ that increase in separation with increasing angle. More importantly, for $\theta=0$ a sharp peak appears for $\lambda\approx\alpha$ with a spectral width at half maximum of less than 1 nm as can be seen in the FIG. 6a inset, which represents a quality factor, $Q=\lambda/\Delta\lambda$, of 5130. FIG. 6b shows the calculated angular dependence of the emissivity at the peak wavelength $\lambda=3.502$ µm. The angular width at half maximum is only 0.021°, which is about seven times narrower than that reported for an optimized one-dimensional tungsten grating emitting near 4 µm. This one-dimensional result is comparable to the angular width of a typical He—Ne laser of 0.12 degrees at $\lambda=3.39$ µm. However, such a comparison is actually better justified for the concentric ring structure. The emission of the structure should exhibit a single highly directional beam instead of the more complex emission pattern from the one-dimensional grating.

The small angular width of beams provided by metal films in accordance with the present invention implies a long spatial coherence on a source plane. This coherence is caused by the surface plasmons and coupling of the surface plasmons to the propagating beam. The coherence length $L_{SP}$ of the surface plasmons for an exemplary structure in accordance with the present invention is estimated to be $\lambda/\Delta\theta=2692\lambda$ which would be the largest surface plasmon coherence length reported for this wavelength region. Indeed, this is longer than $L_{SP}$ for a flat surface, $1/\text{Im}(k_\parallel)=312\lambda$. Other radiating modes not related to the surface plasmons can contribute and decrease the coherence length of the overall field.

To test if a directional beam is observed in experiment an exemplary experimental structure was fabricated in accordance with Example 1 set forth below. As shown in FIG. 6c, a peak at 3.526 µm was observed for the structure fabricated in accordance with Example 1 and confirms that a highly directional beam of emission in the normal direction. This peak appeared only when the apparatus was extremely well aligned to collect at θ=0.

FIG. 6c also shows a calculation for the experimental structure, fabricated in accordance with Example 1, in which thermal expansion and the temperature dependence of the dielectric function were included. At 25 degrees C. the predicted peak should be at 3.507 µm, but at 900 degrees C. shifts to 3.522 µm, in excellent agreement with experiment. This shift is due to thermal expansion rather than the dielectric function. Regarding the spectral width, it is expected that the emission will be broader than the predictions in FIG. 6a due to differences from the optimized structure that can affect the emission behavior. However, the experimental peak with Q=70 is broader than the calculation for the same structure. The origin of this difference is not known, but surface roughness and other structural disorder may play a role. For the experimental structure, the predicted angular width at 900 degrees C. is 1.4 degrees. From this, $L_{SP}$ can be estimated to be $41\lambda=144$ µm. The actual coherence length will be even smaller because of structural imperfections. Thus, because the diameter of the experimental concentric ring structure (2.1 mm) of Example 1 is much larger, this justifies the large concentric ring assumption.

Figure 7:
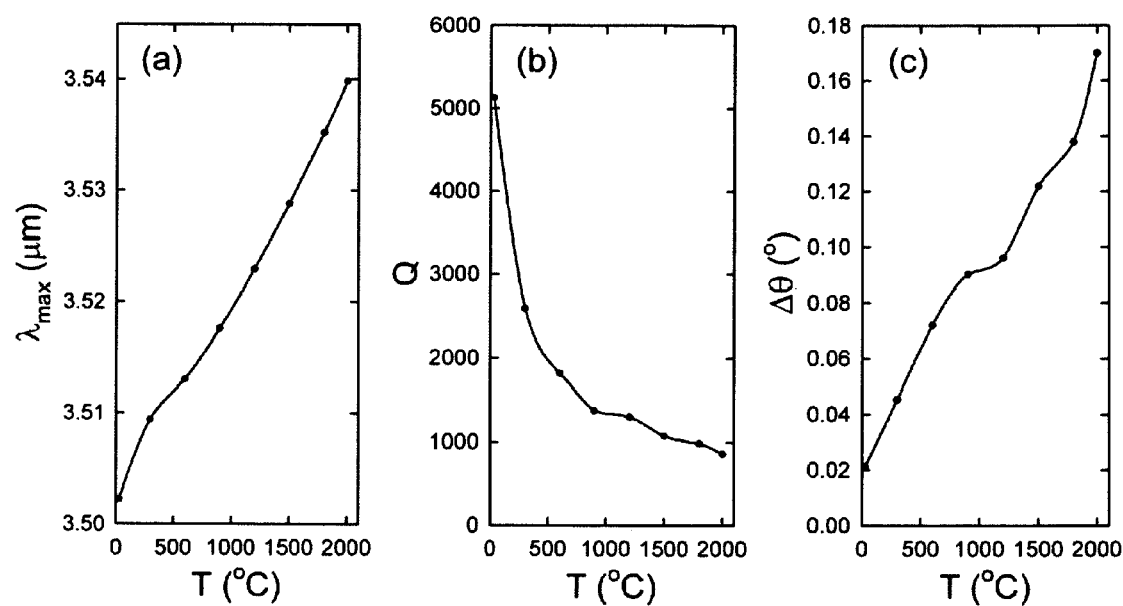
FIG. 7a is a graph showing the calculated temperature dependence of the peak wavelength at the surface normal direction for an exemplary tungsten concentric ring structure in accordance with the present invention.
FIG. 7b is a graph showing the calculated temperature dependence of the quality factor at the surface normal direction for an exemplary tungsten concentric ring structure in accordance with the present invention.
FIG. 7c is a graph showing the calculated temperature dependence of the angular width at the maximum wavelength direction for an exemplary tungsten concentric ring structure in accordance with the present invention.

For an exemplary optimized structure, FIG. 7 shows the expected peak wavelength, quality factor Q, and angular width versus temperature. The peak wavelength $\lambda_{max}$ increases with temperature due to thermal expansion. The total shift is about 40 nm between 25 and 2000 degrees C., which indicates that fine temperature tuning of $\lambda_{max}$ is possible. The quality factor of the beam decreases with increasing temperature due to changes in the dielectric function, which shortens the surface plasmon lifetime. However, even at 2000 degrees C., Q should still be about 1000.

The results here can be contrasted with several related systems. First, while structures in accordance with the present invention are similar to concentric ring structure studied for enhanced transmission, in that case the central hole plays a critical role. In contrast, the central region is completely neglected in accordance with the present invention. Second, certain structures in accordance with the present invention are similar to distributed feedback lasers made from concentric circular gratings. These devices can also generate nearly monochromatic beams. However, the laser output is azimuthally polarized and can be described as a Bessel beam. Bessel beams are diffraction-free but cannot propagate an infinite distance if the source size is finite. In contrast, beams in accordance with the present invention are not limited in propagation length. Moreover, heated concentric ring structures produce unpolarized light due to the random nature of thermal currents. Specifically, thermal fluctuations at two different points are completely uncorrelated as described by the fluctuation-dissipation theorem. The Fourier components of the currents oscillating in different direction are also uncorrelated. Consequently, surface plasmons propagating indifferent directions on the concentric structure are uncorrelated, leading to unpolarized light emission.

Even though this beam is generated by a thermal source, the beam can provide a laser-like source of infrared light. The exact wavelength is tunable by the periodicity of one or both of the grooves and choice of material. By moving to tantalum and silver, wavelengths in the near infrared and visible respectively are also possible. The emission can also have unusual optical coherence properties, which can be useful for some potential applications. For example, applications that depend on scattering or interference effects in the beam or the interaction of the beam with a material or sample can utilize the optical coherence of the emission. The beam cross-section is coherent when moving in the radial direction (out from the center), but not in the azimuthal direction (around the circle).

A beam created by heating a metal film comprising a structure in accordance with the present invention has many potential applications. Structures of the present invention provided on thin metal films, such as a structure comprising concentric rings can be used as sources of monochromatic light on electronic devices. A structure of the present invention can be incorporated into an integrated circuit and heated locally to provide such light source and can be used as local temperature sensors, for example. Such structure can be placed in a heated micro chemical reactor in an exemplary application. Without any wires, such sensor structure can send out an optical beam that indicates the temperature. The metal can be chosen to be chemically robust or to act as a catalyst. Further precision can be achieved if several patterned structures with different periods were used. Each would send out a beam of different wavelength. By measuring each patterned structure, a calibrated temperature could be determined.

A beam from a patterned structure in accordance with the present invention can also be used in chemical sensing. Many molecules absorb specific wavelengths of infrared light that is characteristic of molecular structure. A patterned structure can be placed in a heated reactor to produce a beam that is well-matched to detect a specific molecule. The amount of the beam that is absorbed before the beam exits the reactor provides a convenient wireless signal indicative of the concentration of the specific molecule.

Figure 8:
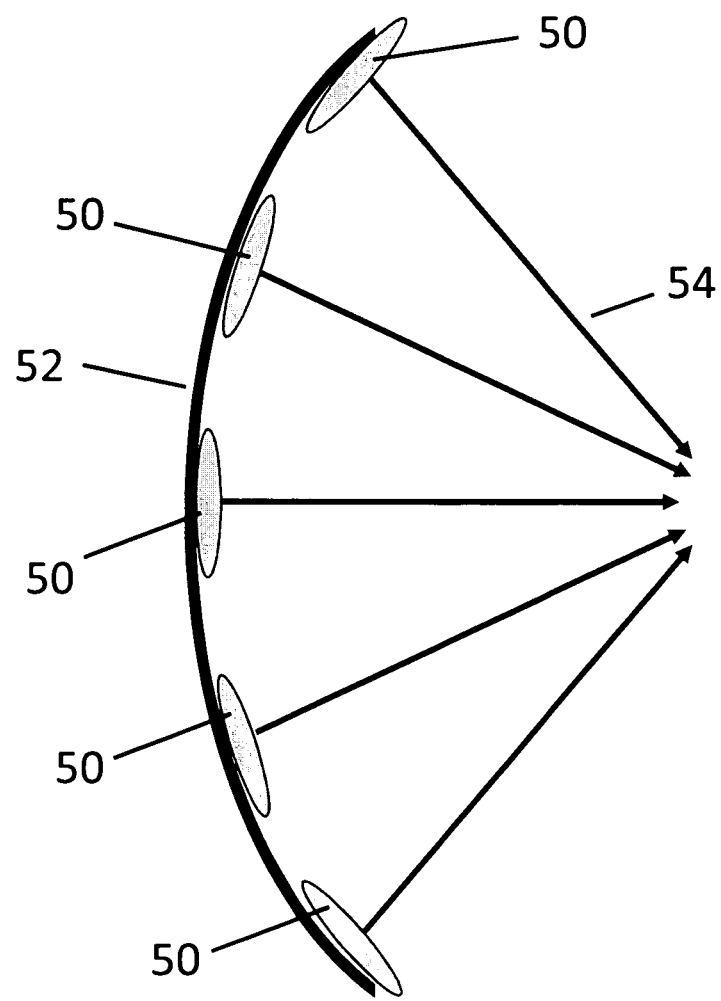
FIG. 8 is a schematic view of an exemplary plasmon device in accordance with the present invention.

Other exemplary applications for structures in accordance with the present invention include projecting beams of heat such as for beams with wavelengths in the infrared or microwaves. As schematically shown in FIG. 8, if plural patterned structures 50 of the present invention are placed on a curved surface 52, beams 54 can be focused as desired.

In addition to producing beams of light, a reverse process is also possible in accordance with the present invention can be tailored. When a patterned structure in accordance with of the present invention is irradiated with a specific wavelength of light from a specific direction, the temperature of the patterned structure will increase.

FIG. 2B shows a silicon template substrate with circular concentric grooves defined by focused ion beam etching. FIGS. 2C, 2D, and 2E indicate the quality of the replicated silver concentric ring structure that is obtained. In particular, electron micrographs taken at glancing incidence as shown in FIG. 2e are effective at exposing surface roughness. The images shown in FIG. 2 reveal ultra-smooth patterned interfaces, which are quantified further below.

Replicated structures in accordance with the present invention have many advantages. First, while the evaporated metal film still has a rough surface after deposition, the device uses the opposite surface, which is smooth. If the metal film is thicker than about 100 nm, the rough side will not influence surface plasmon propagation. Second, because focused ion beam etching or reactive ion etching patterns the silicon substrate, and not the metal film, no ion impurities are implanted in the metal film. The surface composition of metal films patterned with reactive ion etching was analyzed using X-ray photoelectron spectroscopy and showed 49 atomic percent of ions, whereas metal film formed in accordance with the present invention had no detectable impurities. Consequently, a limiting loss mechanism can be avoided with replicated structures of the present invention. Third, after the metal film is removed, the silicon template is ready to replicate additional metal structures of the same pattern. For example, more than 30 metal films have been replicated from the same patterned template substrate without damage.

If it is desired to avoid epoxy, which remains attached to the metal film and can be unwanted for some applications, metal electrodeposition can be used to fabricate structures in accordance with the present invention. For example, in an exemplary embodiment of the present invention, a 250 nm film of copper or other desired metal is evaporated onto a template such as a patterned silicon substrate having a desired structure. Subsequently, another 1 mm of copper is electrodeposited from aqueous 1M copper sulfate (pH 2), for example, on the copper film. The resulting patterned copper film can be separated from the substrate without the use of epoxy. For example, a corner of the film can be lifted with a razor blade and the entire film can be peeled off the substrate.

Figure 9:
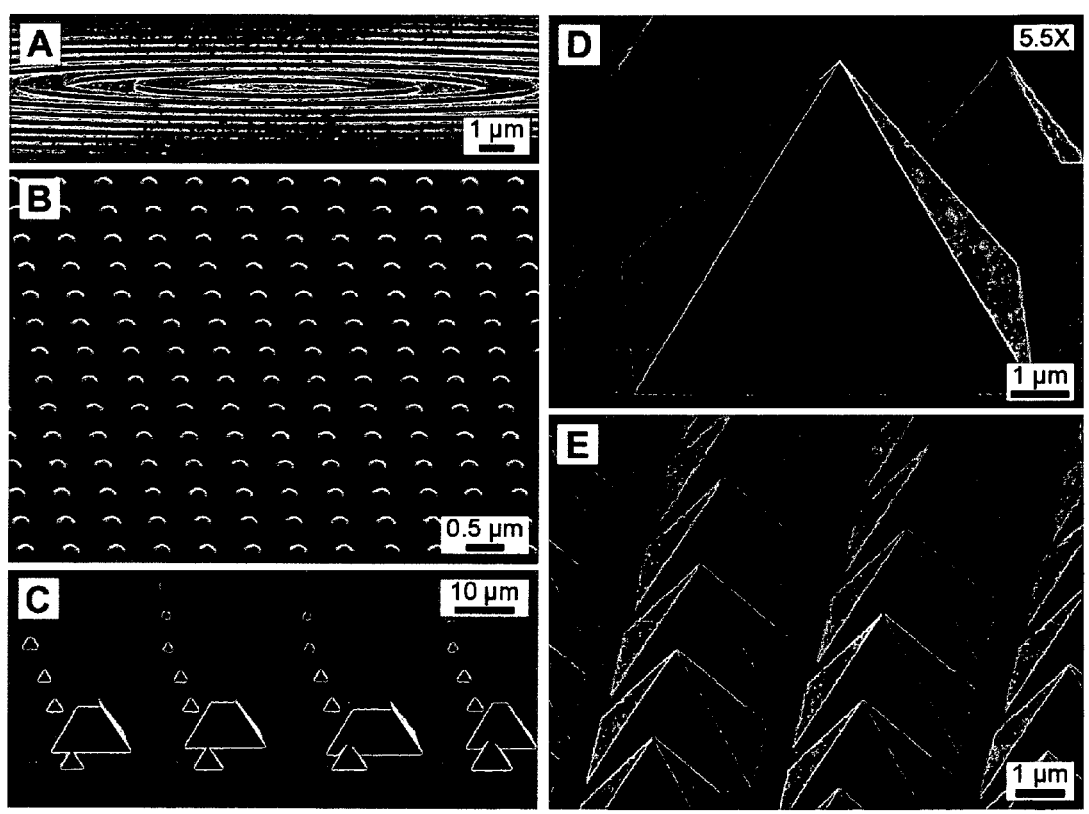
FIG. 9A is an electron micrograph of an exemplary patterned metal film comprising a concentric ring structure in accordance with the present invention.
FIG. 9B is an electron micrograph of an exemplary patterned metal film comprising a bump array in accordance with the present invention.
FIG. 9C is an electron micrograph of an exemplary patterned metal film comprising pyramidal structures in accordance with the present invention.
FIG. 9D is an electron micrograph of an exemplary pyramidal structure in accordance with the present invention.
FIG. 9E is an electron micrograph of an exemplary patterned metal film comprising pyramidal array in accordance with the present invention.

In another exemplary embodiment of the present invention a bump array comprising metal film such as silver for example, can be fabricated such as shown in FIG. 9B. An exemplary silver bump array can be made by patterning a square array of 240 nm diameter pits spaced every 600 nm on a silicon substrate with focused ion beam etching. Next, 250 nm of silver is evaporated followed by electrodeposition of 100 µm of silver from aqueous 1M silver nitrate (pH 10), for example. Like the patterned copper film of FIG. 9A, the resulting silver film can be separated from the substrate without the use of epoxy.

In another exemplary embodiment of the present invention, well-known chemical etching techniques can be used to pattern silicon substrates. When the surface of a (100)-oriented silicon substrate is exposed to a solution of potassium hydroxide, anisotropic etching can lead to pyramidal divets or triangular grooves. In the prior art, pyramidal particles were created by depositing metals only at the bottom of such divets and then releasing the deposits from the substrate to form a colloidal suspension. In accordance with the present invention, an entire array of such pyramids that are attached to a smooth metal film can be formed. This has advantages for plasmonics in terms of the well-controlled placement, orientation, and integration of the structures.

In accordance with the present invention, such divets can be formed by coating a substrate with metals such as chromium and gold, selectively removing these layers with either focused ion beam etching or photolithography, and immersing the substrate in KOH. For example, a gold on chromium mask with square holes can be formed with focused ion beam etching on a silicon substrate. The substrate is immersed in 35 wt % KOH at 80 degrees C. for 15 minutes. After wet-etching the mask, 250 nm of metal such as silver is evaporated and the structure can be removed with epoxy. The resulting exemplary structure is shown in FIG. 9D.

FIG. 9E shows another exemplary embodiment of a pyramid array structure that can be made by anisotropic etching as described above in accordance with the present invention. The structure of FIG. 9E can be made with a chromium mask patterned with a hexagonal array of 1 µm diameter circles spaced by 2.25 µm using photolithography and lift off instead of focused ion beam etching.

It is noted that the structures of FIGS. 9A-E can also be fabricated using electrodeposition if epoxy is undesired. Pyramid structures formed in accordance with the present invention are smooth, highly reproducible, and can comprise sharp tips with radii of curvature as small as 10 nm as shown in the inset to FIG. 9D. Smaller radii of curvature can be achieved.

The surfaces that can be produced in accordance with the present invention have a roughness that can approach that of the template, as measured by atomic force microscopy. For a silicon substrate with a root mean square (rms) roughness of 0.19 nm, 0.65 nm was measured for the corresponding silver film. The largest contribution to this value was the grain boundaries in the polycrystalline silver. Within a single grain, the rms roughness was 0.26 nm, much closer to that of the silicon. It is noted that these measurements were obtained for silver deposited onto test-grade wafers under standard evaporator conditions (room temperature substrate, pressure below $10^{-5}$ Pa, and a deposition rate of 0.4 nm/s).

No techniques were used, such as ultra-flat wafers or high-temperature deposition, to decrease the roughness. The smoothness of the metal film is generally limited by the method used to pattern the template substrate. For example, the concentric ring patterned structure shown in FIG. 2B had an rms roughness of 1.89 nm due to redeposition of material during patterning of the grooves with focused ion beam etching. The corresponding silver film shown in FIG. 2C had a roughness of 2.18 nm. Even in this case, concentric ring patterned structure, which is designed to have a sharp and directional absorption feature due to optical coupling to surface plasmons, exhibited a sharp absorption peak as shown in FIG. 21 that was not observed in the same structure made by directly patterning an evaporated metal film with focused ion beam etching or the like as conventionally known.

Figure 21:
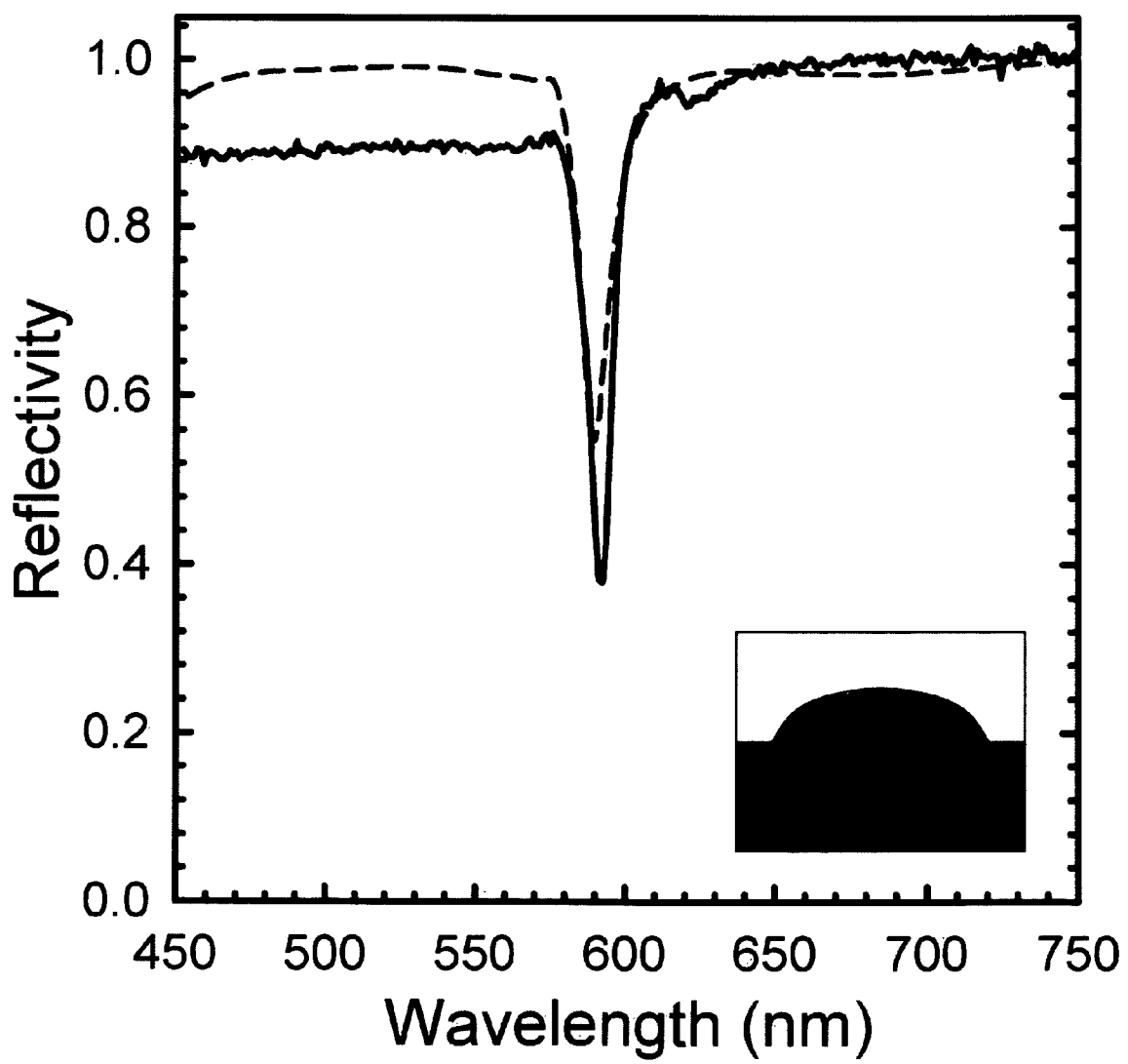
FIG. 21 is a graph showing the experimental reflectivity spectrum (solid line) and simulated reflectivity spectrum (dashed line) of a silver concentric ring structure in accordance with the present invention.

FIG. 21 shows the experimental reflectivity spectrum (solid line) of a silver concentric ring structure similar to that in FIG. 2C. An inverted optical microscope illuminated the concentric ring structure with white light. The reflected signal was collected through the microscope objective and imaged onto the input of a fiber-optic-coupled ultraviolet-visible spectrophotometer. An aperture between the sample and the objective limited the collection angle to +/−1.2 degrees from normal. The reflectivity was normalized with the signal collected from a flat portion of the silver film next to the concentric ring structure. A simulation (black dashed curve) was obtained using parameters (580 nm period, 50 nm ridge height, and 220 nm ridge width) estimated from electron micrographs of the real structure. The theoretical peak shape was found to be sensitive to the structure. The estimated cross section of the ridges used in the simulation is shown in the inset of FIG. 21. The calculated reflectivity was obtained using the finite difference time domain method and a non-uniform mesh with a 5 nm nominal grid size above and below the air/silver interface and a 0.5 nm grid size at this interface. A simulated broadband pulse that contained wavelengths from 450 to 750 nm impinged on the structure and the reflected power was Fourier transformed (with zero padding after the signal had decreased to $10^{-9}$ of the original power).

To decrease the computation time, the calculation was performed on an infinite linear grating and the response was averaged over all angles (applicable for a large concentric ring structure). To compare with experiment, which utilized unpolarized light, the TE and TM response was averaged and normalized by the reflected power from a perfectly flat silver film.

Figure 10:
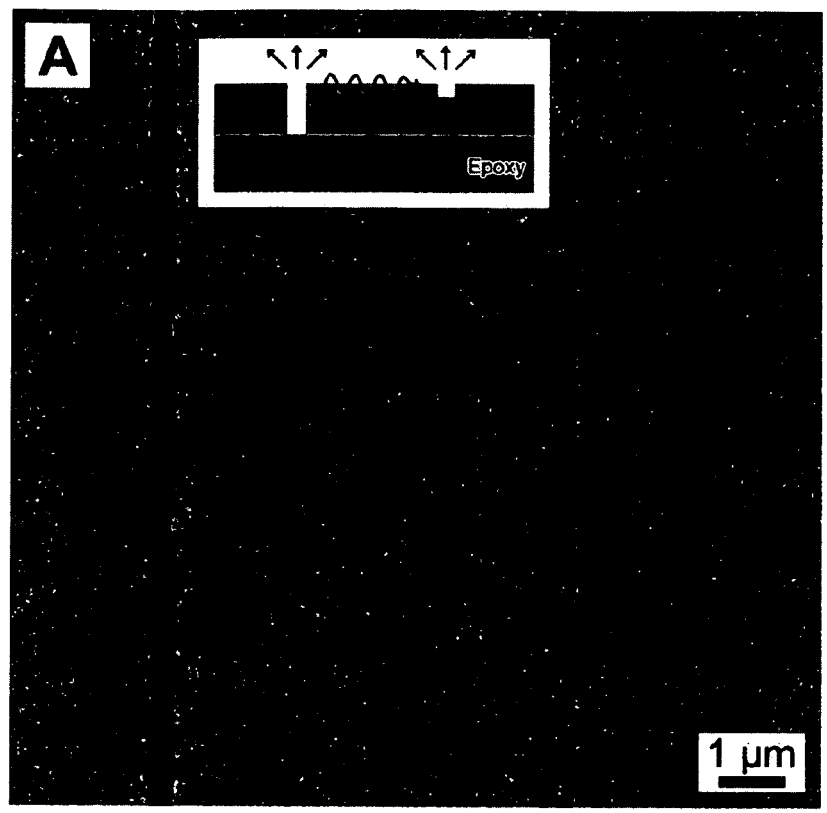
FIG. 10A is an electron micrograph of a slit-groove pair for measuring the surface plasmon propagation length in a nm thick silver film.
FIG. 10B is a graph showing propagation length versus wavelength for patterned metal films in accordance with the present invention.
Figure 10:
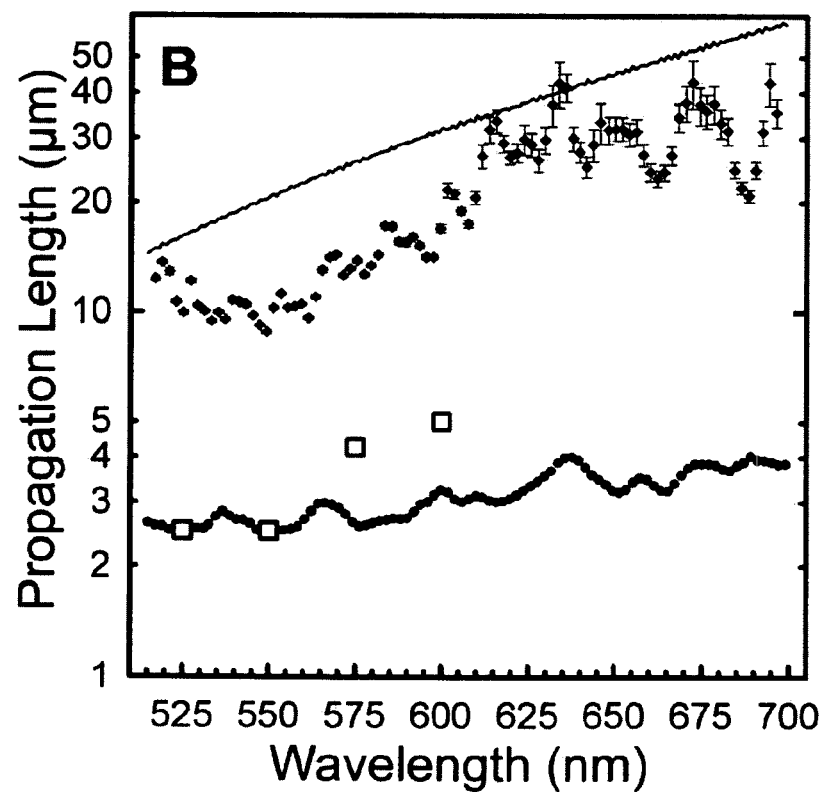

To quantify the quality of the films formed in accordance with this invention further, the propagation length of the surface plasmons was measured for an exemplary 200 nm thick silver film. FIG. 10A is an electron micrograph of a slit-groove pair for measuring the surface plasmon propagation length in the 200 nm thick silver film. The 200 nm thick silver film was prepared on epoxy and then a series of identical slits were etched through the metal with focused ion beam etching. For each slit, a parallel groove was added in the film at a different fixed separation d. By mounting the sample on an optical microscope and illuminating the epoxy side with white light, surface plasmons could be launched on the film as light passed through the slits. When these propagating plasmons struck the grooves as shown in the inset to FIG. 10A, the grooves scattered light that could be collected by the microscope objective. For each groove, the image of the scattered light was projected onto the entrance of an imaging monochromator and the spectrum was measured with a CCD camera. Light that was transmitted directly through the slits in the sample was not allowed to enter the monochromator. From an analysis of all such spectra, the intensity of the light scattered from the grooves as a function of the separation d was determined. Because this is directly related to the intensity of the surface plasmons at the grooves, the plasmon propagation length could be extracted for each wavelength.

Even for a perfectly smooth pure metal surface, the propagation length would be finite due to ohmic losses within the metal, which is characterized by the imaginary component of the dielectric function of the metal. For a typical film, the actual propagation length will be smaller due to surface roughness, scattering at grain boundaries, and absorption due to implanted impurities. However, for surfaces formed in accordance with the present invention, where the roughness has been greatly reduced and the impurities avoided, values closer to that of the ideal interface can be achieved. To test this, ellipsometry was used to measure the dielectric function of two exemplary silver films and the ideal surface plasmon propagation length was predicted as discussed below.

Figure 22:
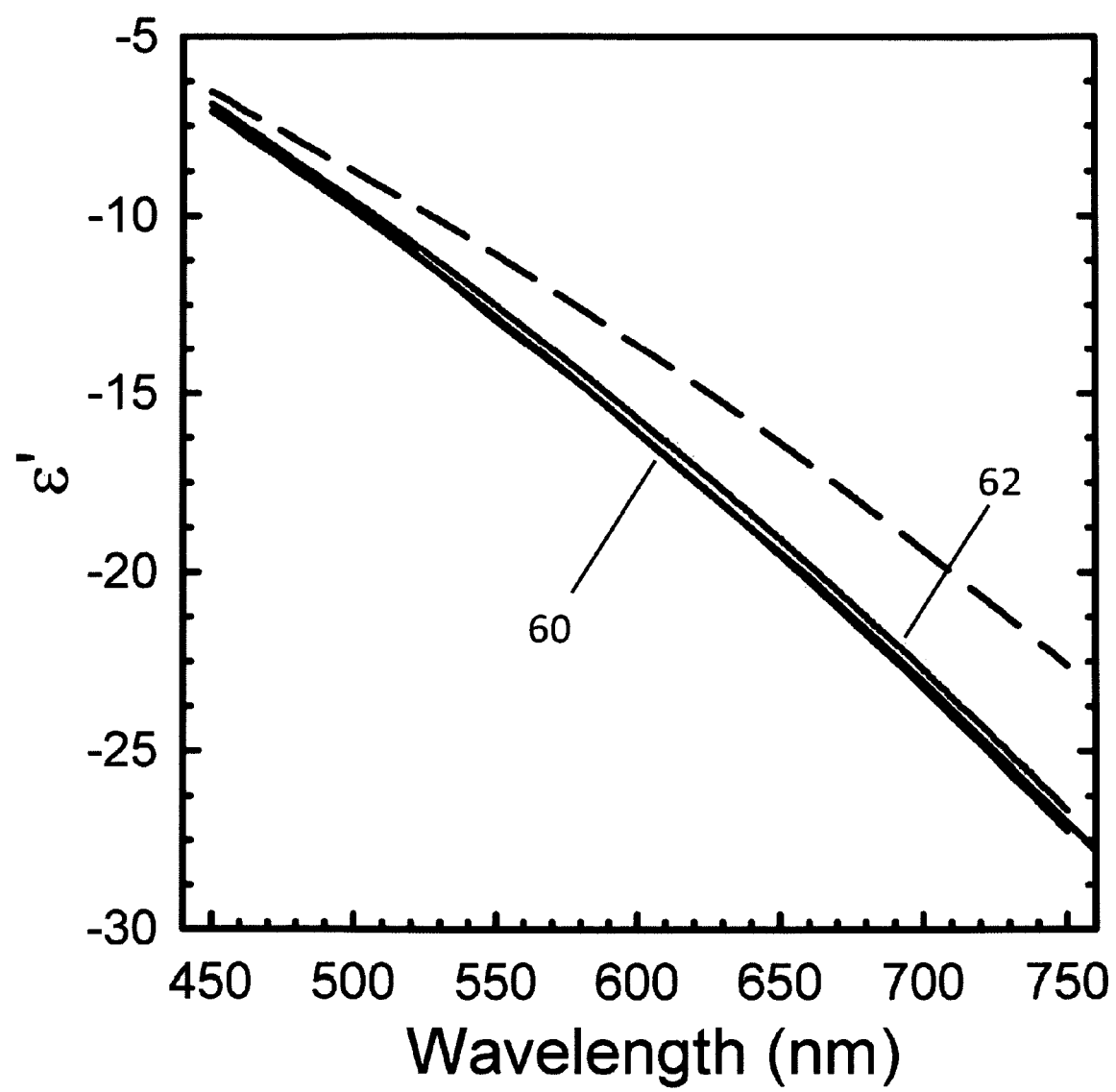
FIG. 22 is a graph showing the real component of the dielectric function versus wavelength for silver films deposited under different conditions together with reported data.

FIG. 22 shows the real component of the dielectric function, $\epsilon'$, extracted via ellipsometry for the two exemplary silver films. The curve identified by reference numeral 60 represents data for the smooth surface of a 250 nm thick film made in accordance with the present invention. Specifically, the film was deposited by thermal evaporation onto a silicon wafer at room temperature. The curve identified by reference numeral 62 represents the smooth surface of another 250 nm thick film made in accordance with the present invention. However, the film was deposited by slow thermal evaporation onto a silicon wafer heated to about 75 degrees C. For comparison, $\epsilon'$ values reported by Palik, E. D.; Ed., Handbook of Optical Constants of Solids (Academic Press, Orlando, 1985) and Johnson, P. B.; Christy, R. W.; Optical constants of the noble metals, Physical Review B 6, 4370 (1972) are shown by the black dashed and black solid curves, respectively. Due to strong overlap with the curves identified by reference numeral 60 and 62, the black curve is mostly concealed in FIG. 22.

Figure 23:
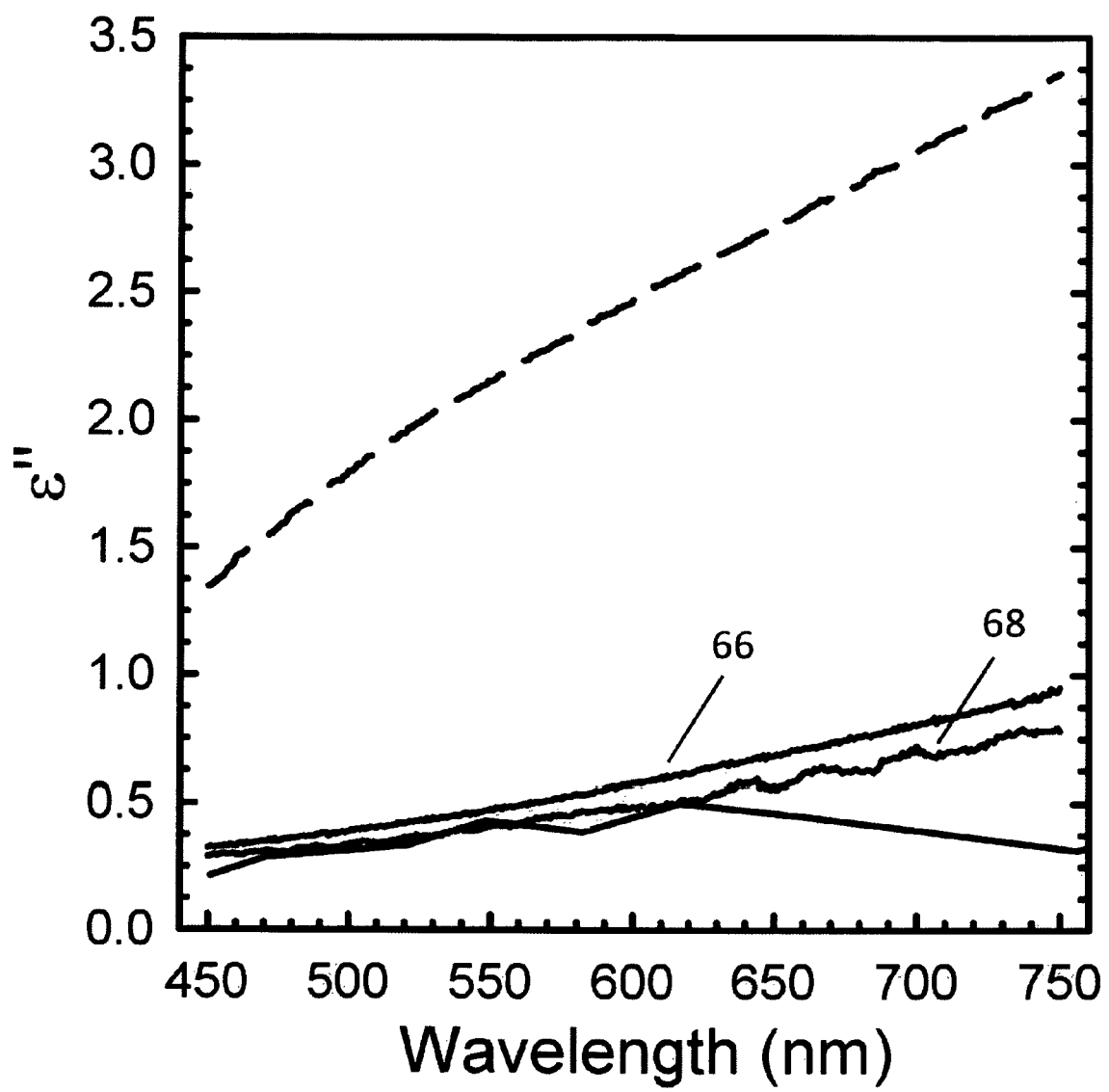
FIG. 23 is a graph showing the imaginary component of the dielectric function versus wavelength for silver films deposited under different conditions together with reported data.

FIG. 23 shows the imaginary component of the dielectric function, $\epsilon''$, extracted via ellipsometry for the same two exemplary silver films. The curve identified by reference numeral 66 represents data for the smooth surface of a 250 nm thick film made in accordance with the present invention. Specifically, the film was deposited by thermal evaporation onto a silicon wafer at room temperature. The curve identified by reference numeral 68 represents the smooth surface of another 250 nm thick film made in accordance with the present invention. However, the film was deposited by slow thermal evaporation onto a silicon wafer heated to about 75 degrees C. For comparison, $\epsilon''$ values reported by Palik, E. D.; Ed., Handbook of Optical Constants of Solids (Academic Press, Orlando, 1985) and Johnson, P. B.; Christy, R. W.; Optical constants of the noble metals, Physical Review B 6, 4370 (1972) are shown by the black dashed and black solid curves, respectively.

These data indicate that the films made in accordance with the present invention have improved optical properties. The real component of the dielectric function is more negative than data from Palik and the imaginary component of the dielectric function is smaller than data from Palik. These effects arise due to the decrease in electronic scattering by the elimination of surface roughness. Because electronic scattering is related to ohmic losses in a metal, this implies that surface plasmons will propagate further on films made in accordance with the present invention not only due to reduced plasmon scattering, but also because the ohmic losses are smaller.

From the data in FIGS. 22 and 23, the ideal propagation length for surface plasmons on a particular film can be calculated. Essentially, such values represent the propagation length expected for a perfectly smooth film with minimal grain boundary scattering. This propagation length is limited only by the ohmic losses in the metal. However, because the present invention can decrease the ohmic losses of the metal through reduction in electron scattering caused by surface roughness, the ideal propagation length can be increased.

Figure 24:
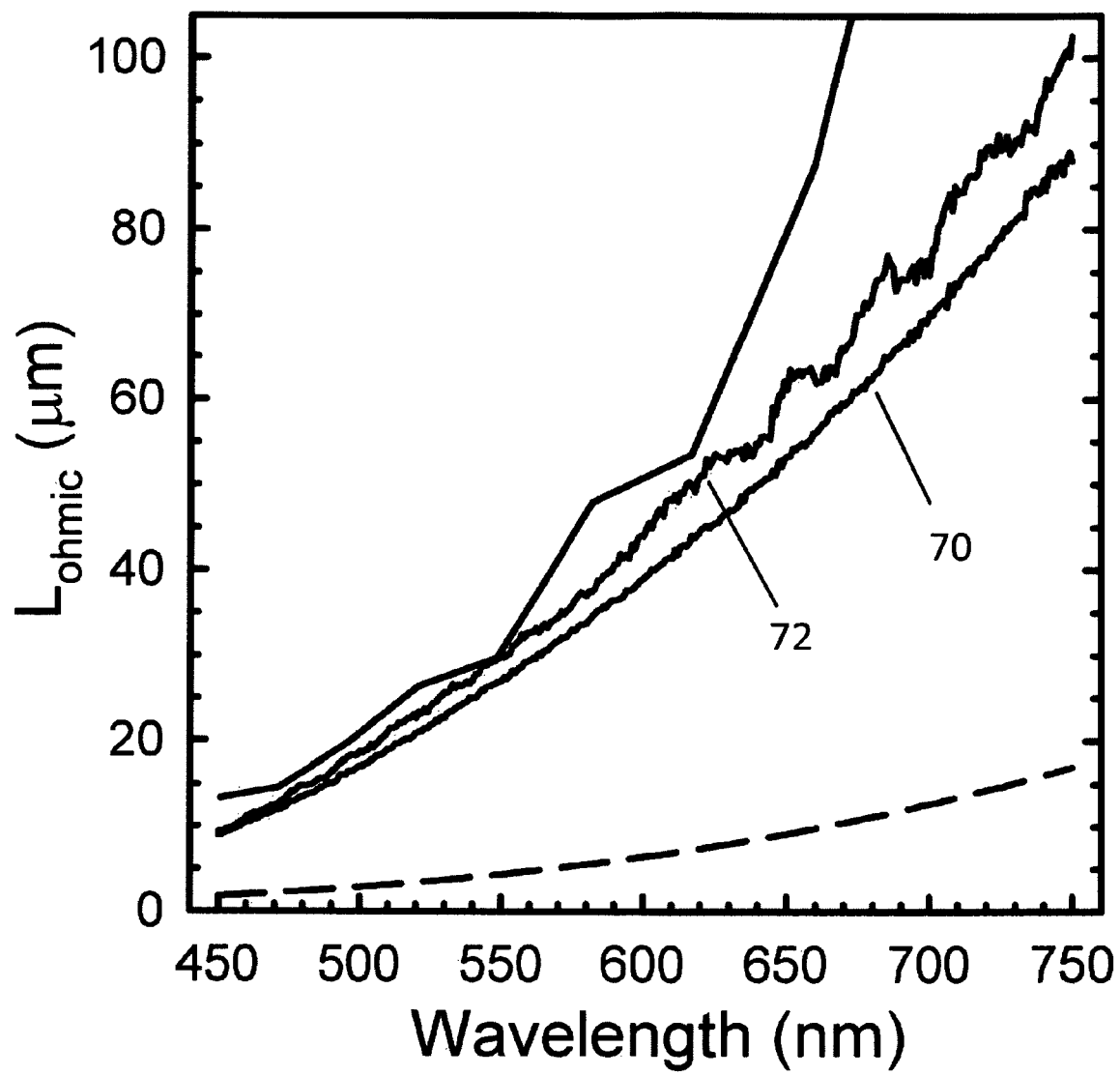
FIG. 24 is a graph showing the ohmic propagation lengths for surface plasmons versus wavelength for silver films deposited under different conditions together with reported data.

FIG. 24 plots the ideal propagation lengths, $L_{ohm}$, for surface plasmons versus wavelength for the two exemplary silver films represented in FIGS. 22 and 23. The curve identified by reference numeral 70 represents data for the smooth surface of a 250 nm thick film made in accordance with the present invention. Specifically, the film was deposited by thermal evaporation onto a silicon wafer at room temperature. The curve identified by reference numeral 72 represents the smooth surface of another 250 nm thick film made in accordance with the present invention. However, the film was deposited by slow thermal evaporation onto a silicon wafer heated to about 75 degrees C. For comparison, $L_{ohm}$ values reported by Palik, E. D.; Ed., Handbook of Optical Constants of Solids (Academic Press, Orlando, 1985) and Johnson, P. B.; Christy, R. W.; Optical constants of the noble metals, Physical Review B 6, 4370 (1972) are shown by the black dashed and black solid curves, respectively. Again, the values of surface plasmon propagation lengths predicted for the films made in accordance with the present invention are much longer than those predicted with the data from Palik.

Ohmic losses are also related to the resistance of the metal to carrying electrical current. Therefore, the films made in accordance with the present invention exhibit extremely low electrical resistance. For single-crystalline films made in accordance with the present invention, grain boundary scattering can also be reduced or eliminated. Grain boundary scattering can affect both surface plasmon scattering and electron scattering. Reduction or elimination of the influence of grain boundary scattering both on the surface plasmons and electrons further increase the surface plasmon propagation lengths and further decrease the resistance of the metal film.

While the surface plasmon propagation lengths can be important for some applications, the increase in these propagation lengths is also indicative of the improved behavior of the films. Because of decreased losses, either for surface plasmons or electrical current, many characteristics can be improved. For example, plasmonic resonances, where light is focused to nanometer-scale volumes, can be more effective. Light can be concentrated in smaller volumes. For electrical devices, metal contacts made in accordance with this invention can exhibit lower resistance for the same thickness.

FIG. 10B shows a plot of propagation length versus wavelength. Slit-groove separations of 10, 12, 20, 25, 30, 35, and 40 μm were used and the spectrum of the scattered light from each groove was captured separately. At every wavelength the decay of the scattered intensity was fit with an exponential to extract the propagation length (diamonds). Fringes appear in these data due to interference of surface plasmons propagating toward the groove and those reflected back, as confirmed by finite difference time domain simulations. Taking the midpoint of these oscillations, the propagation lengths of films in accordance with the present invention are near ideal values, especially at longer wavelengths. From the measured dielectric function of the silver, the expected propagation length was determined assuming only ohmic losses (solid line) Reported values for silver films made by conventional methods are also shown (squares) for comparison. FIG. 10B also plots results from slit-groove experiments performed on conventional films (circles).

To further characterize films in accordance with the present invention, large-area substrates were fabricated for surface-enhanced Raman scattering (SERS). In general, Raman scattering can identify molecules through the unique vibrational signatures of the molecules. Because of the concentrated electric fields near patterned metal surfaces, gold and silver films have been studied for enhanced molecular and biological sensing. Indeed, signal enhancements above $10^8$ for specific surface structures have been reported. However, more important for sensing applications is the ability to generate enhancements with films that are easily and reproducibly fabricated.

Figure 11:
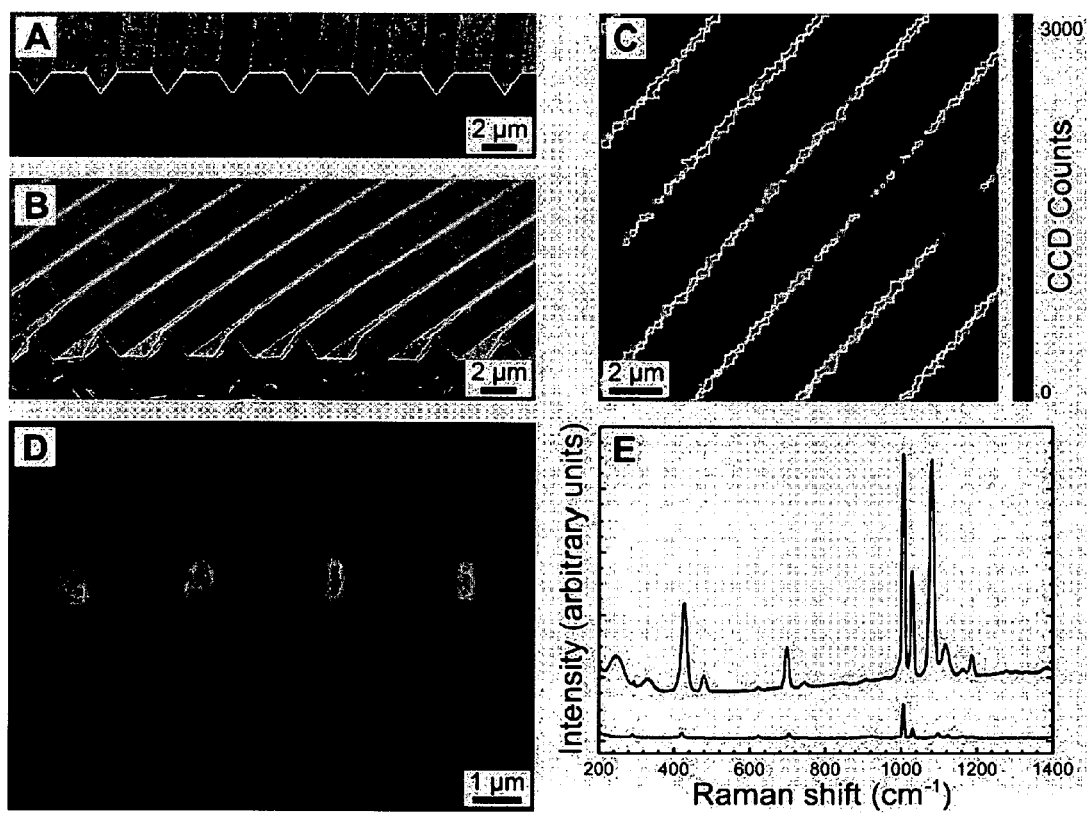
FIG. 11A is an electron micrograph of a silicon wafer patterned with an exemplary grating of triangular grooves to provide a template substrate in accordance with the present invention.
FIG. 11B is an electron micrograph of a silver film with triangular ridges replicated using the template substrate shown in A.
FIG. 11C shows a SERS signal as a function of position from a scanning confocal Raman microscope for scans parallel to the ridge tops of the silver film shown in FIG. 11B.
FIG. 11D shows a SERS signal as a function of position from a scanning confocal Raman microscope for scans perpendicular to the ridge tops of the silver film shown in FIG. 11B.
FIG. 11E is a graph showing the Raman signal from neat benzenethiol (lower curve) with that from a monolayer-coated substrate (upper curve) when both were excited at 532 nm.

FIG. 11A is an electron micrograph of a silicon wafer patterned with an exemplary grating of triangular grooves by photolithography, lift-off, and anisotropic etching to provide a template substrate in accordance with the present invention. The grooves cover about 2×2 cm$^2$ on the wafer. FIG. 11B shows a silver film with triangular ridges formed using the template substrate shown in FIG. 11A. The silver film was formed by evaporating 280 nm of silver followed by 100 μm of silver by electrodeposition. It is noted that due to a slight misalignment of the grooves and the <110> direction of the silicon wafer, step edges formed in the grooves during anisotropic etching that are reproduced on the sides of the silver ridges.

A self-assembled monolayer of benzenethiol was attached to the surface of the silver film by incubation in 1 mM benzenethiol in ethanol for 16 hours. A scanning confocal Raman microscope was used to collect the SERS signal as a function of position. The excitation wavelength was 514 nm. The resulting images for scans parallel to the ridge tops shown in FIG. 11C reveal uniformly enhanced signals near the triangular peaks.

Cross-sectional scans (perpendicular to the ridge tops) shown in FIG. 11D show that the response is high at the peak while remaining low along the smooth sides of the ridges and the valleys in between. Using an apparatus consistent with that described in K. C. Bantz, C. L. Haynes, Langmuir 24, 5862 (2008), the overall SERS enhancement was quantified by comparing the Raman signal from neat benzenethiol (lower curve) with that from the monolayer-coated substrate (upper curve) when both were excited at 532 nm and is shown in FIG. 11E. After correcting for the number of molecules, an enhancement factor of $1.4 \times 10^7$ was determined. Because this value represents an average over the entire surface, the actual enhancement factor near the ridge peak is higher. These results indicate the potential of forming inexpensive uniform plasmonic substrates for sensing.

Figure 12:
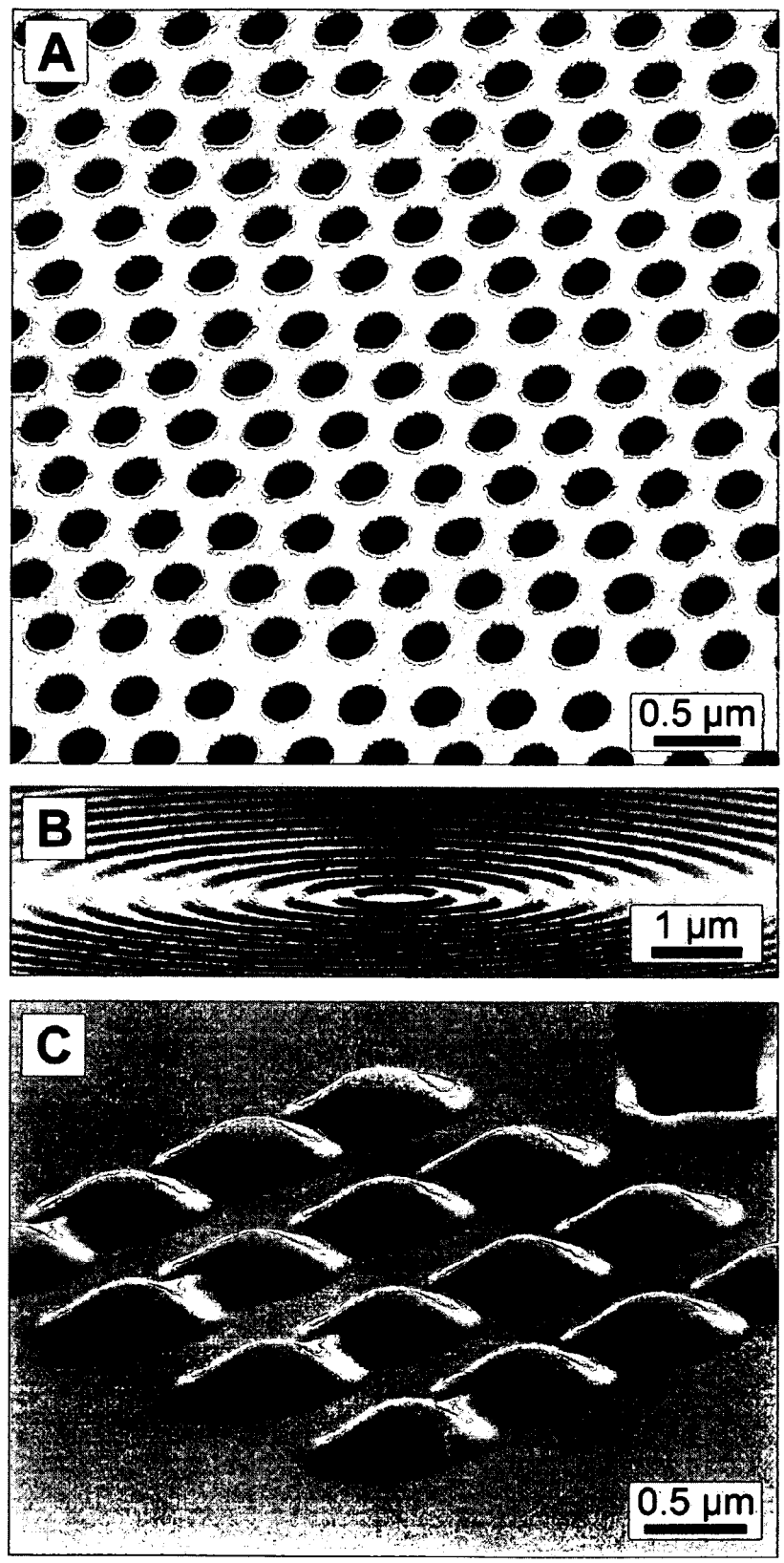
FIG. 12A is an electron micrograph of an exemplary patterned metal film comprising an array of openings in accordance with the present invention.
FIG. 12B is an electron micrograph of an exemplary patterned metal film comprising a concentric ring structure in accordance with the present invention.
FIG. 12C is an electron micrograph of an exemplary patterned metal film comprising a bump array in accordance with the present invention.

Devices in accordance with the present invention can use any desired structural elements such as bumps, ridges, grooves, openings, and combinations thereof, for example, to achieve any desired functionality. For example, a nanoscale hole can allow enhanced transmission of electromagnetic waves through a metal film. FIG. 12A shows an exemplary metal film in accordance with the present invention and comprising an array of 265 nm diameter holes spaced by 450 nm formed in a 30 nm thick metal film (silver, in this exemplary embodiment). The structure was formed by assembling a close-packed monolayer of 450 nm polystyrene spheres on a silicon wafer by spin coating, shrinking the spheres with reactive ion etching, and then depositing a chromium mask. After chemically removing the spheres, reactive ion etching was used to transfer a hexagonal array of deep circular pits into the silicon and the mask was removed. By evaporating silver on top of such pits and adding epoxy, a thin silver film with an array of holes was obtained.

Figure 13:
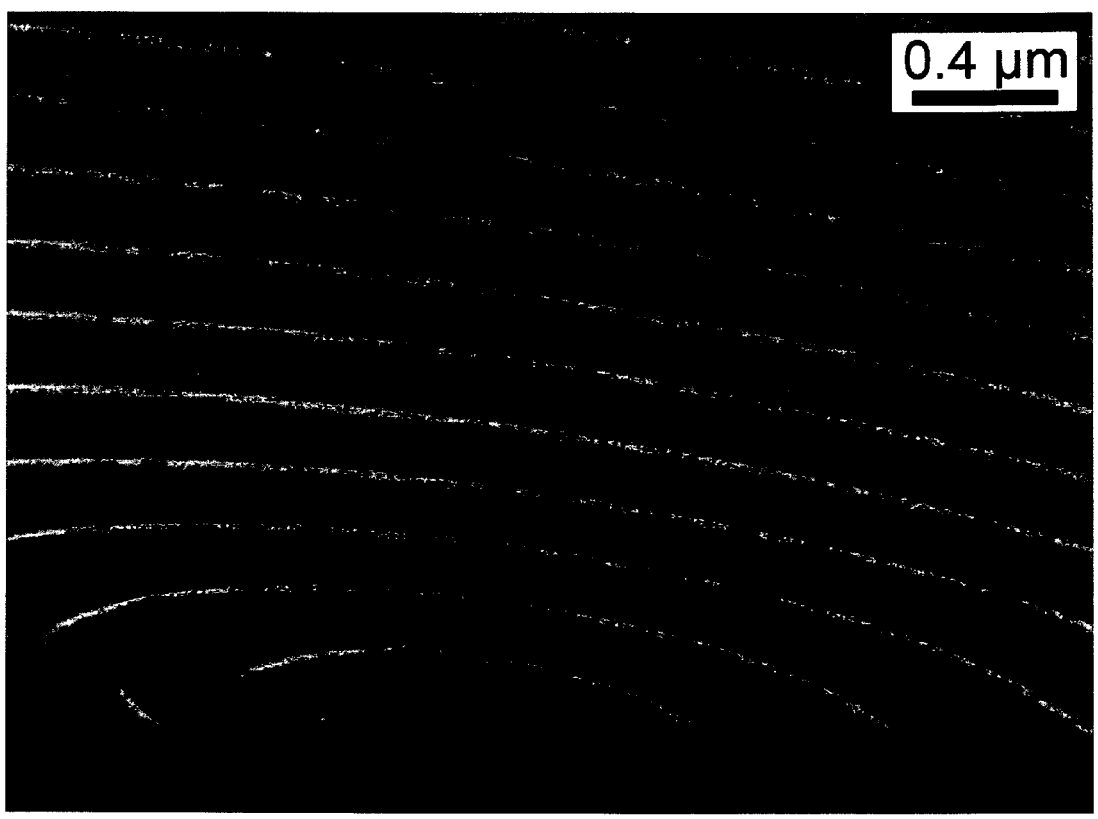
FIG. 13 is an electron micrograph of an exemplary metamaterials structure comprising a concentric ring structure in accordance with the present invention.

Devices in accordance with the present invention can also include one or more multilayer structures. For example, thin patterned films with alternating layers of metal and insulator can exhibit a negative refractive index, which can lead to useful optical phenomena. Because this property arises only in artificial materials, typically referred to as metamaterials, such materials must be fabricated. FIGS. 12B and 12C and FIG. 13 show metamaterial structures that can be formed in accordance with the present invention. For example, in an exemplary embodiment, a thin film of metal such as silver, for example, is deposited on patterned silicon templates. Alternate layers of an insulator such as alumina, for example, and metal are the deposited by sputtering or other suitable deposition method. Because metal adheres to alumina better than silicon, the entire stack can be removed with epoxy in accordance with the present invention. FIG. 12B and FIG. 13 shows an exemplary concentric ring structure replicated from the silicon template substrate in accordance with the present invention. An exemplary embodiment comprises alternating layers of silver (30 nm thick) and alumina (15 nm thick) having a total of seven layers depending on the desired functionality. FIG. 12C shows an exemplary bump array that can be fabricated in accordance with the present invention and can comprise the same layer structure as the structure of FIG. 12B. An exemplary structure comprises bumps 650 nm in diameter and spaced 650 nm apart. Devices made in accordance with the structures of FIGS. 12B and 12C can be used as superlenses, for example. As long as suitable adhesion is provided, other metal and insulator materials can be used.

Metal films in accordance with the present invention may be one or both of single-crystal material and polycrystalline material. For many applications of patterned metal films, it would be helpful to have a film that is (i) made from a single-crystal of metal or (ii) made from a polycrystalline metal with very large grains or both, as desired. For example, grain boundaries can cause surface plasmons to be scattered as they propagate in the film. Because devices fabricated in accordance with the present invention utilize the metal film that was initially in contact with the patterned template substrate, such devices can have much larger grains than would be expected in a thin metal film. In other words, the metal-substrate interaction can increase the size of the grains because the grains grow in contact with the substrate. These larger grains then result in better performance. Moreover, if the films are annealed (either with one thermal cycle or multiple thermal cycles) after the initial film is deposited but before the film is removed from the template substrate, the grains can grow further and single crystals can be provided. If needed a seed crystal may be placed in contact with the film to facilitate single crystal growth. For example, when the template substrate comprises a single-crystalline silicon wafer (with or without a thin native oxide layer), metals can be deposited epitaxially on the template. This causes the nucleation and growth of many grains that are all oriented in the same direction. Subsequent annealing can cause these grains to join so a continuous single-crystalline metal film that can then be removed from the template is obtained.

Even if the metal film remains polycrystalline, the grains will increase in size during the thermal treatment. Also, the metal-substrate interaction may cause the grains to align preferentially. Thus, even if the resulting metal film is polycrystalline, once the metal film is removed from the template substrate, the exposed patterned surface may have a specific metal facet or a small subset of facets exposed. This can have applications in sensing where specific facets can have unique interactions with a desired chemical, biological molecule, particle, etc.

These metal-surface interactions do not have to be arbitrary. That is, the patterned template substrate may be chosen or tailored to control the crystallinity of the deposited metal film through influencing the size and orientation of the grains, and the response of the grains to a specific post-deposition thermal process.

While patterned films with surface roughnesses below 1 nm can be provided in accordance with the present invention, the roughness will depend on the template upon which the film is deposited. Thus, if a patterned film with a specific roughness is desired, this can also be obtained. A patterned template substrate with the desired roughness can be fabricated and used in accordance with the present invention. Moreover, because the template substrate can replicate plural patterned films with the desired roughness, a reproducible fabrication procedure is provided.

As discussed above, a beam of thermal emission can be produced when a patterned film of metal such as tungsten, for example, and similar to that shown in FIG. 2 is heated. A patterned film in accordance with the present invention can provide a "laser-like" source of infrared light. Thermal emission that is narrow in both spectral and angular width, as shown in FIG. 3, can be provided. However, for some applications, it is not desired to have a beam with such narrow spectral and angular width. For example, emitter materials are used in thermo-photovoltaic devices that absorb as much energy as possible from a heat source (e.g. the sun), convert this energy to heat, and then re-emit light as thermal emission. This emission can then be converted to electricity by a photocell that is matched to the appropriate wavelength of the emission (e.g. a photocell made from InGaAs or InGaAsSb). However, if the emitter produces emission that is too narrow, both in spectrum and angular width, the total amount of emitted power that is sent toward the photocell can be low. To increase the emitted power for applications such as thermo-photovoltaics, the structure can be tailored to broaden the emission both in spectral and angular width. This can be done easily because the exemplary structure shown in FIG. 2 can be designed to control the angular and spectral width of the thermal emission. For example, by adding roughness to the structure, or aperiodicity to the groove spacing, or other changes to one or more of the grooves and pattern, the spectral and angular widths of the thermal emission can be broadened. This will increase the total power of the emission when such films are used as emitters in thermophotovoltaic applications or other related applications.

Patterned films and methods of making such films in accordance with the present invention can be used in many additional applications. Exemplary applications include:

1. Superlenses or negative index materials that are based on either plasmonic resonances or LC coupled transmission lines. These can have large frequency bandwidths for possible uses as perfect lenses for sub-wavelength imaging and sub-wavelength lithography including fast replication of nanometer scale structures using a simple mask and making optical replicas in a thin photoresist.
2. Hyperlenses (both flat and patterned) to obtain perfect (or near-perfect) subwavelength focusing. These have use as: (i) large-scale concentrators for focusing sunlight in small volumes for solar concentrators or solar cells, (ii) far-field imagers of subwavelength features, (iii) tools for far-field sub-wavelength optical lithography and (iv) perfect lenses. Sometimes these devices have been described as optical black holes.
3. Directional emitters for light emitting diodes and directional absorbers for photovoltaics. The zero or negative index of refraction can create a narrow cone of emission/absorbance even with vacuum, and hence useful for directional light emission, both for embedded light sources like quantum dots and for thermal emission.
4. Optical cloaking devices.
5. Nano-antennas useful for photovoltaics and light absorption.
6. Single-step smooth fabrication of optoelectronic devices.
7. Plasmonic solar cells.
8. Efficient sensing devices, including those that utilize surface-enhanced Raman scattering (SERS) spectroscopy. In particular, adiabatic focusing on tapered metal structures can dramatically enhance sensitivity of plasmonic SERS devices. Also, sensors that use changes in the refractive index on a plasmonic film when a specific chemical, biological molecule, or particle binds to the film.
9. Free electron lasers. Simple cathodoluminescence setups have been used to show free electron emission in metal dielectric structures if an accelerated electron beam passes through an aperture in a huge gradient of dielectric constants. The electron beam starts emitting in different wavelengths ranging from infrared to ultraviolet depending on incident beam energy and the gradients.
10. Nanoresonators using the adiabatically focused light in smooth tapered metal surfaces to a metal-dielectric structure. Similar applications based on sub-wavelength focusing of surface plasmon polaritons using smooth tapered surfaces so the plasmons become localized in nanoscale volumes. Such focusing can lead to realization of many functionalized nano-optical devices.
11. Optical wormholes.
12. Microfluidic devices that incorporate patterned metal-dielectric structures for optical sensing.
13. Microfluidic devices that utilize the tailored metal surfaces to enhance or inhibit cell growth, bacterial growth, or virus growth.
14. Patterned metal films to inhibit biofilm growth in membranes, on microfluidic devices, on surfaces, or on microfluidic optoelectronic devices.
15. Ultra-smooth patterned metal surfaces for metrology devices: cavities, etalons, or mirrors. For example, such surfaces could be used for ultrasensitive force measurements, such as through Casimir forces.

16 Patterned electronics for electrochemical or optoelectronic devices.
17 Patterned membranes.
18 Microreactors that comprise patterned channels of refractory metals such as tungsten. This would allow high temperature reactions in microfluidic devices.

The present invention will now be further described with reference to the following illustrative examples.

Example 1

In this exemplary embodiment of the present invention, a concentric ring structure was fabricated. The structure had a period of 3.50 µm. A 500 nm thick tungsten film was sputtered onto a clean silicon wafer. A concentric ring pattern was formed in photoresist via photolithography and then formed in the tungsten with reactive ion etching with $SF_6$. The structure was similar to the exemplary silver structure shown in FIG. 2 and had 300 grooves 170 nm deep and 2.19 µm wide. The structure was heated under vacuum on a stage (Linkam TS 1500) to 900 degrees C. and the emission was detected with a cooled InSb photodiode attached to a Fourier transform infrared spectrometer. Two apertures defined a collection angle of 0.1 degrees.

Example 2

In this exemplary embodiment of the present invention, desired metal is deposited (silver, gold copper, platinum, for example) on a patterned silicon wafer with a thin layer of silica followed by a thin layer of chromium or titanium. After the deposition, methylsilsesquioxane (MSQ) oligomers are spin coated on the evaporated chromium or titanium, and stamped (or transferred with conformal contact) on the desired substrate. The patterned silicon, metal and methysilsesquioxane (or any other spin on glass like HSQ, for example) and substrate assembly is then baked at 80 degrees C. to formed cross linked silica from MSQ and the patterned silicon is stripped away leaving the patterned metal and silica composite on the desired substrate. Here the pattern is transferred from one silica coated substrate to another, using chromium or titanium as a "glue". Any other similar processes which use an adhesion promoter (Cr, Ti, for example) on one substrate to transfer patterned metals can be used.

Example 3

Figure 14:
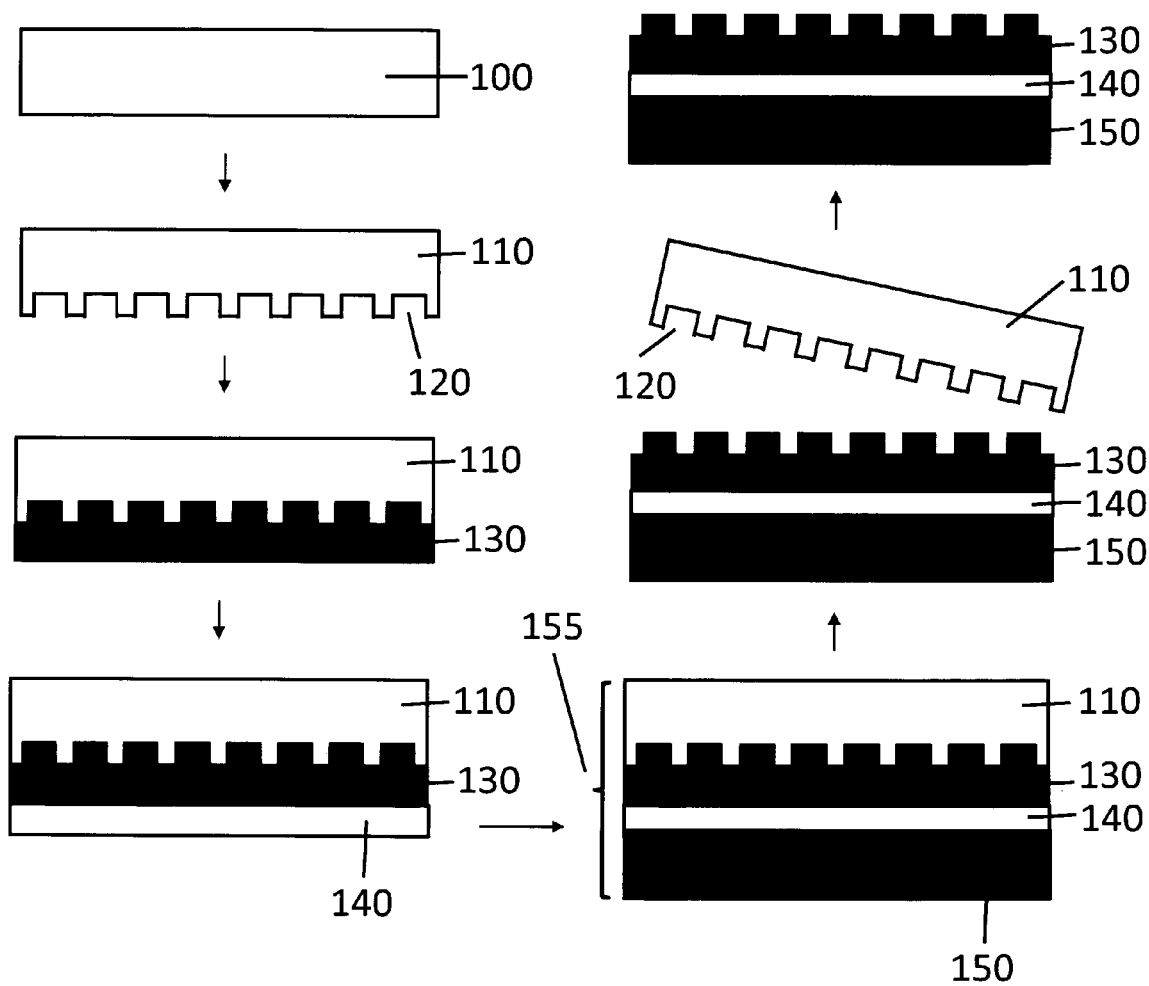
FIG. 14 is a schematic view of an exemplary method for replicating a patterned metal thin-film structure in accordance with the present invention.

With reference to FIG. 14, in this embodiment of the present invention a surface of silicon substrate 100 is patterned by conventional techniques, such as photolithography, electron beam lithography, or focused ion beam etching to provide patterned template substrate 110 having patterned surface 120. Alternatively, anisotropic etching of the silicon surface can be utilized. Patterned surface 120, as shown, comprises a series of grooves but any desired features can be used. Grooves can have dimensions in the range of tens of nanometers to hundreds of micrometers but any desired dimensions can be used. Patterned template substrate 110 is then cleaned with a piranha etch for 10 minutes and dried in nitrogen gas. The clean patterned template substrate 110 is then coated with metal film 130 using thermal evaporation or using sputtering in argon gas at a pressure of 5 millitorr, for example. Other deposition techniques can be used depending on the desired metal and desired properties.

Deposited metal film 130 is then coated with adhesive layer 140 comprising resin such as 1:1 weight mixture Resin A and B of EPOTEK 377 resin from Epoxy Technologies. Silicon substrate 150 is then placed on adhesive layer 140 so metal film 130 is sandwiched between substrates 110 and 150 to form assembly 155. Assembly 155 is cured in an oven at 130 degrees C. for one hour. Assembly 155 is then taken out of the oven and allowed to cool. When substrates 110 and 150 are separated, the poor adhesion of metal film 130 to patterned surface 120 allows clean separation of metal film 130 from patterned surface 120.

The feature surfaces of patterned metal film 130 are defined by the surface characteristics of patterned surface 120 of silicon template substrate 100 and can therefore be extremely smooth and flat because silicon substrates with high quality surfaces in terms of flatness and smoothness are readily available. After removal from metal film 130, patterned template substrate 110 can be cleaned and used to replicate additional patterned metal films. It is noted that while the procedure above can provide extremely smooth patterned metal films, patterned template substrate 110 can be patterned to contain any desired roughness or surface characteristics as desired.

Example 4

Figure 15:
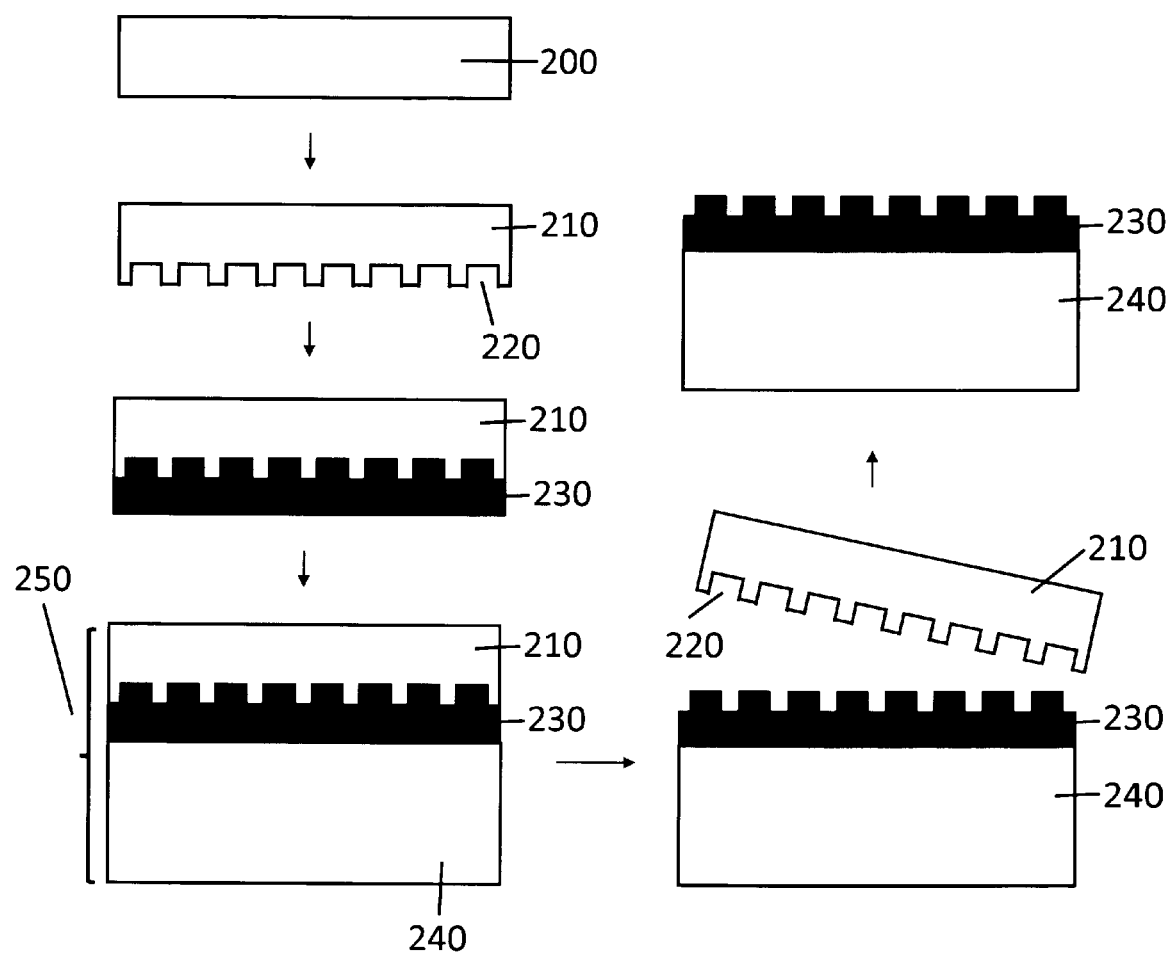
FIG. 15 is a schematic view of another exemplary method for replicating a patterned metal thin-film structure in accordance with the present invention.

This embodiment of the present invention is similar to the embodiment described in Example 3 but does not require a second substrate. Referring to FIG. 15, a surface of silicon substrate 200 is patterned by conventional techniques, such as photolithography, electron beam lithography, or focused ion beam etching to provide patterned template substrate 210 having patterned surface 220. Alternatively, anisotropic etching of the silicon surface can be utilized. Patterned surface 220, as shown, comprises a series of grooves but any desired features can be used. Grooves can have dimensions in the range of tens of nanometers to hundreds of micrometers but any desired dimensions can be used. Patterned template substrate 210 is then cleaned with piranha etch ($H_2SO_4$:$H_2O_2$=1:1) for 10 minutes and dried in nitrogen gas. Clean patterned template substrate 210 is then coated with metal film 230 using thermal evaporation or using sputtering. For example, thermal evaporation can be used for metals such as silver and sputtering in argon gas at a pressure of 5 millitorr can be used for metals such as tungsten. Other deposition techniques can be used depending on the desired metal and desired properties.

Because deposited metal film 230 is typically relatively thin and somewhat fragile, metal film 230 usually cannot be removed directly from template substrate 210 even though metal film 230 has poor adhesion to patterned surface 220 of template substrate 210. In this embodiment, metal film 230 is then coated with adhesive layer 240 of 1:1 weight mixture Resin A and B of EPOTEK 377 resin from Epoxy Technologies and forms assembly 250. Assembly 250 is cured in an oven at 130 degrees C. for one hour. Assembly 250 is then taken out of the oven and allowed to cool. Adhesive layer 240 can then be peeled off. Due to the poor adhesion of metal film 230 to patterned surface 220 of template substrate 210, when adhesive layer 240 is removed metal film 230 remains attached to adhesive layer 240 and separates from patterned surface 220 of template substrate 210.

The feature surfaces of replicated patterned metal film 230 are defined by the surface characteristics of patterned surface 220 of silicon template substrate 210 and can therefore be extremely smooth and flat because silicon substrates with high quality surfaces in terms of flatness and smoothness are readily available. After removal from metal film 230, patterned template substrate 210 can be cleaned and used to replicate additional patterned metal films. It is noted that while the procedure above can provide extremely smooth patterned metal films, patterned template substrate 210 can be patterned to contain any desired roughness or surface characteristics as desired.

Example 5

Figure 16:
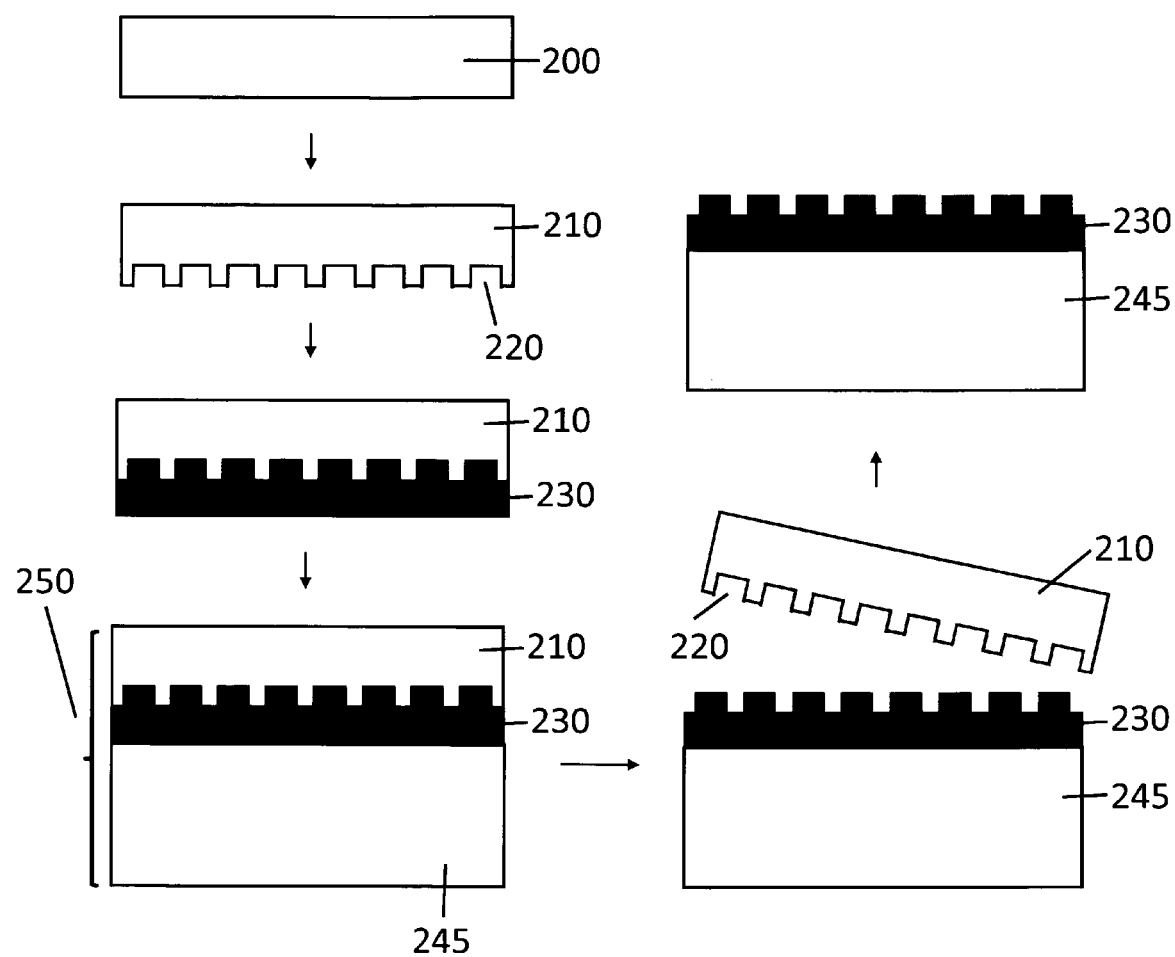
FIG. 16 is a schematic view of another exemplary method for replicating a patterned metal thin-film structure in accordance with the present invention.

This embodiment of the present invention is similar to the embodiment described in Example 4 but does not require the use of an adhesive such as epoxy. Referring to FIG. 16, a surface of silicon substrate 200 is patterned by conventional techniques, such as photolithography, electron beam lithography, or focused ion beam etching to provide patterned template substrate 210 having patterned surface 220. Alternatively, anisotropic etching of the silicon surface can be utilized. Patterned surface 220, as shown, comprises a series of grooves but any desired features can be used. Grooves can have dimensions in the range of tens of nanometers to hundreds of micrometers but any desired dimensions can be used. Patterned template substrate 210 is then cleaned with piranha etch ($H_2SO_4:H_2O_2=1:1$) for 10 minutes and dried in nitrogen gas. Clean patterned template substrate 210 is then coated with metal film 230 using thermal evaporation or using sputtering. For example, thermal evaporation can be used for metals such as silver and sputtering in argon gas at a pressure of 5 millitorr can be used for metals such as tungsten. Other deposition techniques can be used depending on the desired metal and desired properties.

Metal film 230 is then coated with electrodeposited layer 245 of either the same metal or a different metal by electrodeposition. For example, metal film 230 and the underlying silicon substrate 210 is immersed in 1 molar electrolyte solution (1M $AgNO_3$ for silver or 1M $CuSO_4$ for copper), and the pH of the solution is adjusted (to pH 10 for $AgNO_3$ using $NH_4OH$ and to pH 1-2 for $CuSO_4$ using $H_2SO_4$). Metal film 230 and substrate 210 are then immersed in the solution as the cathode while a platinum wire is used as the anode. A constant voltage is applied between the reference electrode (e.g. lithium nitrate) and the sample (0.08-0.2V for Cu and a varying voltage from 0.3-0.6V for silver) while the current is monitored. Electrodeposited layer 245 is plated until layer 245 is thick enough to function to remove metal film 230 from patterned surface 220.

The feature surfaces of replicated patterned metal film 230 are defined by the surface characteristics of patterned surface 220 of silicon template substrate 210 and can therefore be extremely smooth and flat because silicon substrates with high quality surfaces in terms of flatness and smoothness are readily available. After removal from metal film 230, patterned template substrate 210 can be cleaned and used to replicate additional patterned metal films. It is noted that while the procedure above can provide extremely smooth patterned metal films, patterned template substrate 210 can be patterned to contain any desired roughness or surface characteristics as desired.

Example 6

Figure 17:
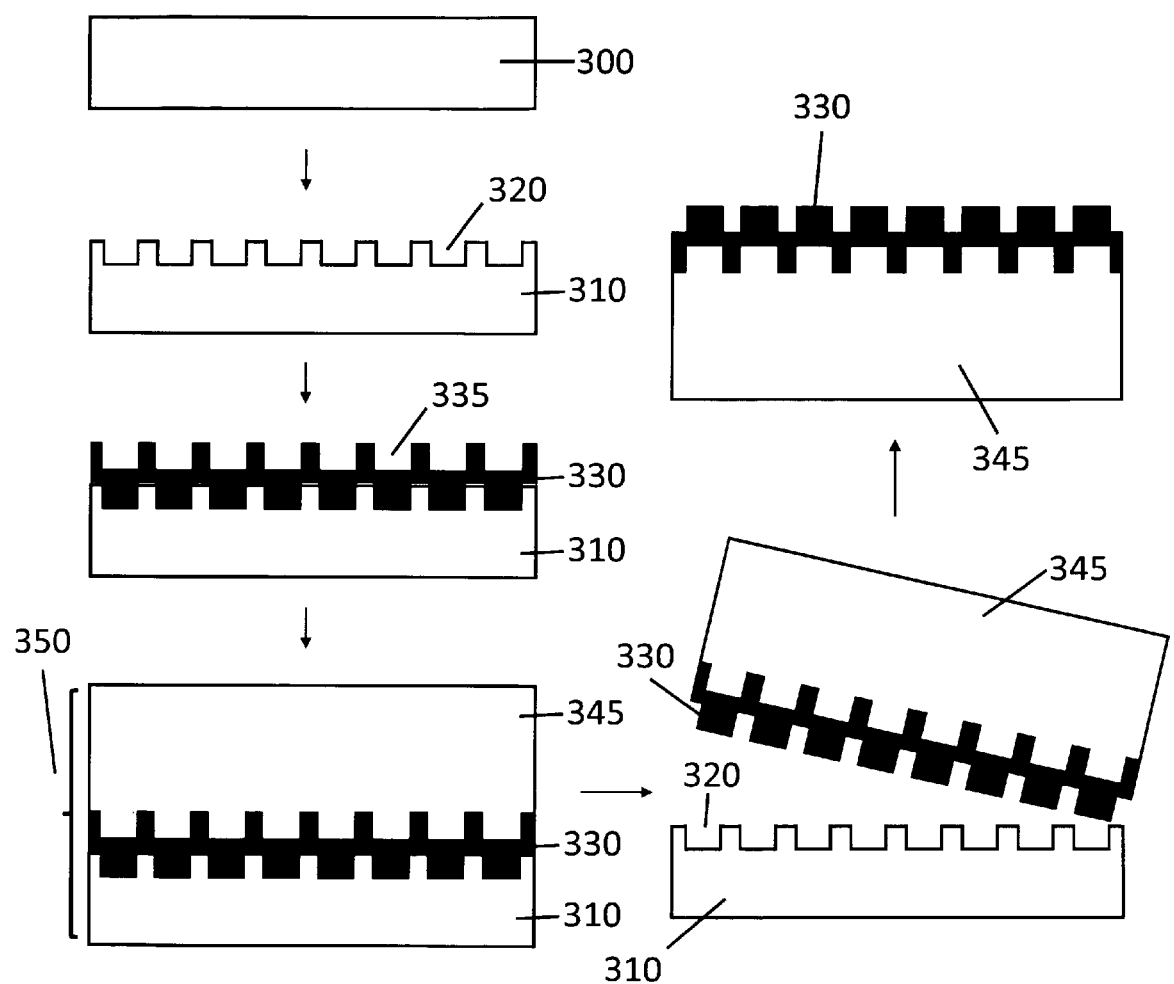
FIG. 17 is a schematic view of another exemplary method for replicating a patterned metal thin-film structure in accordance with the present invention.

This embodiment of the present invention is similar to the embodiment described in Example 4 but the metal film is patterned on both sides. Referring to FIG. 17, a surface of silicon substrate 300 is patterned by conventional techniques, such as photolithography, electron beam lithography, or focused ion beam etching to provide patterned template substrate 310 having patterned surface 320. Alternatively, anisotropic etching of the silicon surface can be utilized. Patterned surface 320, as shown, comprises a series of grooves but any desired features can be used. Grooves can have dimensions in the range of tens of nanometers to hundreds of micrometers but any desired dimensions can be used. Patterned template substrate 310 is then cleaned with piranha etch ($H_2SO_4:H_2O_2=1:1$) for 10 minutes and dried in nitrogen gas. Clean patterned template substrate 310 is then coated with metal film 330 using thermal evaporation or using sputtering. For example, thermal evaporation can be used for metals such as silver and sputtering in argon gas at a pressure of 5 millitorr can be used for metals such as tungsten. Other deposition techniques can be used depending on the desired metal and desired properties.

In this embodiment, the thickness of metal film 330 is thinner than or comparable to the depth of the pattern so that metal film 330 is patterned on both sides. As shown, the thickness of metal film 330 is comparable to the depth of the grooves, but if other desired patterns are used, the thickness of metal film 330 must be comparable to or thinner than the characteristic length of the pattern so that the pattern still appears on the upper patterned surface 335 of the deposited film. Pattern surface 335 of deposited metal film 330 is then coated with adhesive layer 345 comprising resin such as 1:1 weight mixture Resin A and B of EPOTEK 377 resin from Epoxy Technologies.

Because deposited metal film 330 is typically relatively thin and somewhat fragile, metal film 330 usually cannot be removed directly from template substrate 310 even though metal film 330 has poor adhesion to patterned surface 320 of template substrate 310. In this embodiment, metal film 330 is then coated with adhesive layer 345 of 1:1 weight mixture Resin A and B of EPOTEK 377 resin from Epoxy Technologies and forms assembly 350. Assembly 350 is cured in an oven at 130 degrees C. for one hour. Assembly 350 is then taken out of the oven and allowed to cool. Adhesive layer 345 can then be peeled off. Due to the poor adhesion of metal film 330 to patterned surface 320 of template substrate 310, when adhesive layer 345 is removed metal film 330 remains attached to adhesive layer 345 and separates from patterned surface 320 of template substrate 310.

The feature surfaces of patterned metal film 330 are defined by the surface characteristics of patterned surface 320 of silicon template substrate 300 and can therefore be extremely smooth and flat because silicon substrates with high quality surfaces in terms of flatness and smoothness are readily available. After removal from metal film 330, patterned template substrate 310 can be cleaned and used to replicate additional patterned metal films. It is noted that while the procedure above can provide extremely smooth patterned metal films, patterned template substrate 310 can be patterned to contain any desired roughness or surface characteristics as desired.

Example 7

This embodiment is similar to Example 6 except, instead of epoxy, additional metal is deposited by electrodeposition such as described in Example 5 and is used to separate the metal film replica from the patterned template substrate.

Example 8

This embodiment is similar to Examples 3, 4, and 6 except the epoxy layer is cured with ultraviolet light instead of heat.

Example 9

This embodiment is similar to Examples 3-8 except an additional high temperature annealing step was performed before the metal film replica was separated from the patterned template substrate. This allowed the size of the metallic grains to be increased. Because the grains grow while the grains are still in contact with the template substrate, the surface roughness is not increased by the grain growth. For example, to increase the grain size of gold films, such films were placed in a pre-heated oven at 500 degrees C. under an inert atmosphere for 5 minutes. The film was then cooled to room temperature and separated from the template substrate directly or with an epoxy adhesive layer.

Figure 18:
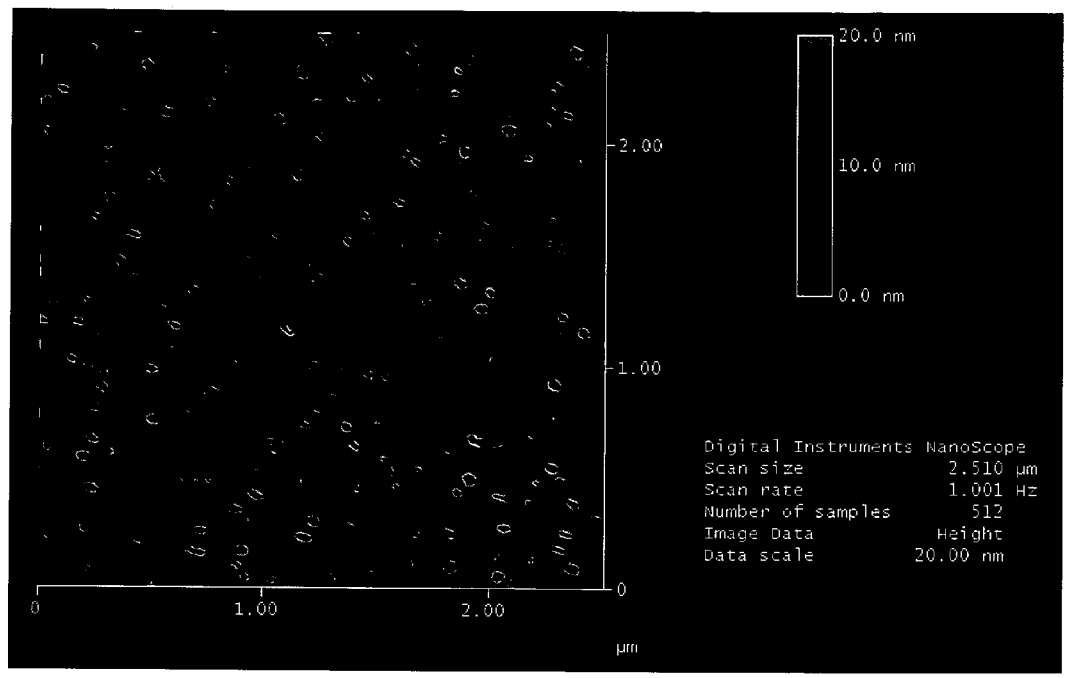
FIG. 18A is an atomic force microscope image of a surface of an evaporated gold film.
FIG. 18B is an atomic force microscope image of the gold surface shown in FIG. 18A after replication and annealing in accordance with the present invention.
Figure 18:
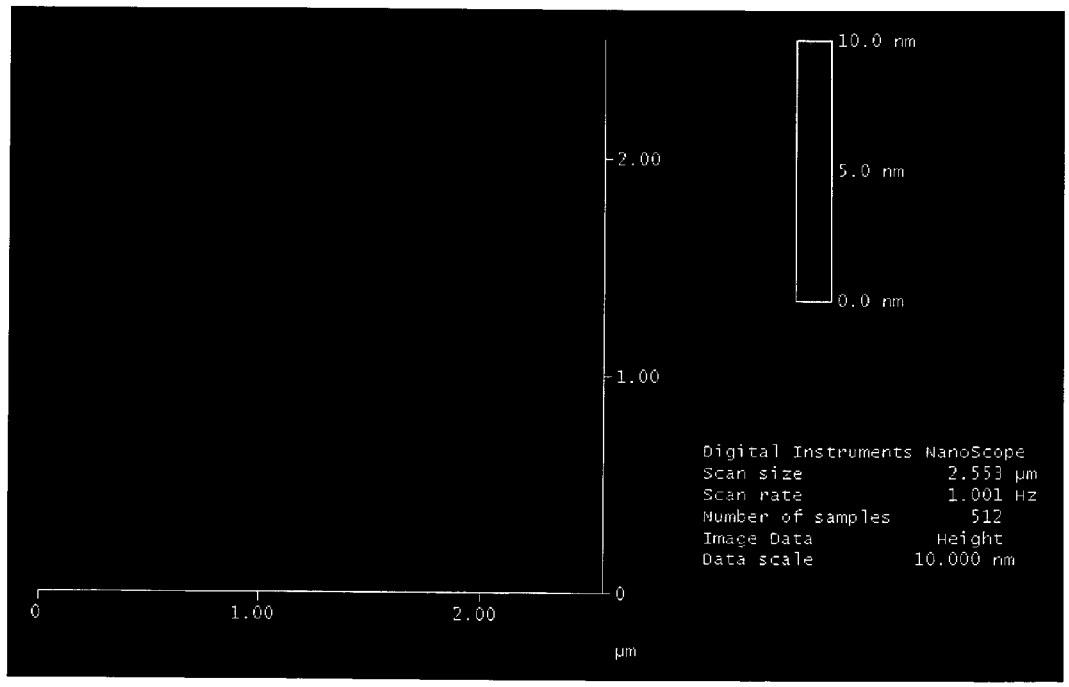
Figure 19:
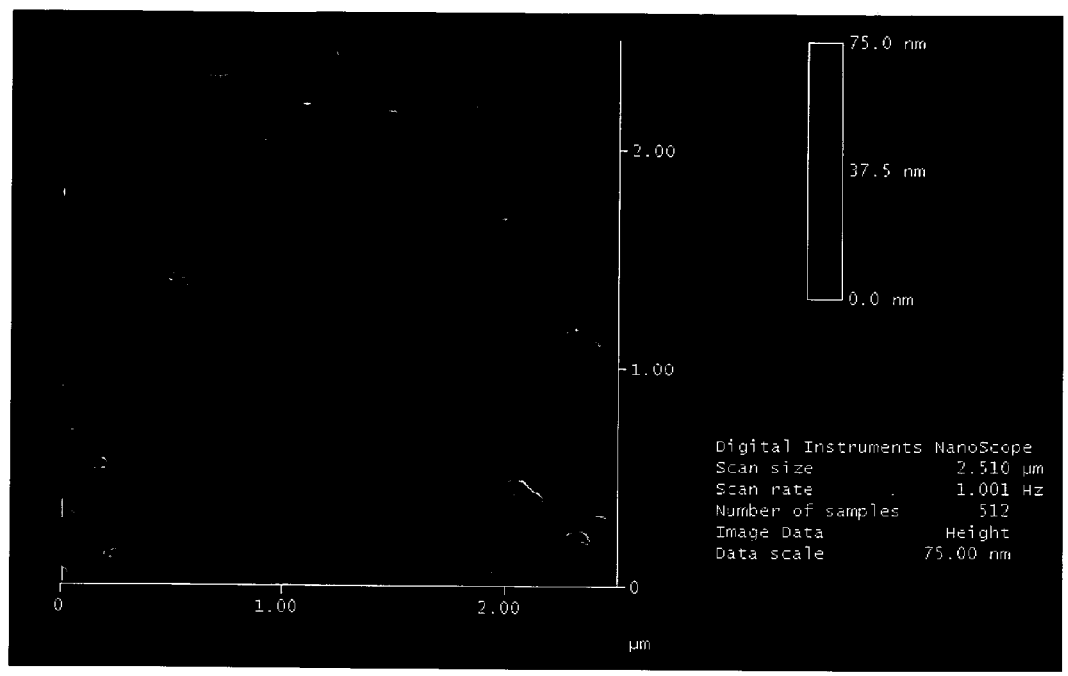
FIG. 19A is an atomic force microscope image of a surface of an evaporated silver film.
FIG. 19B is an atomic force microscope image of the silver surface shown in FIG. 18A after replication and annealing in accordance with the present invention.
Figure 19:
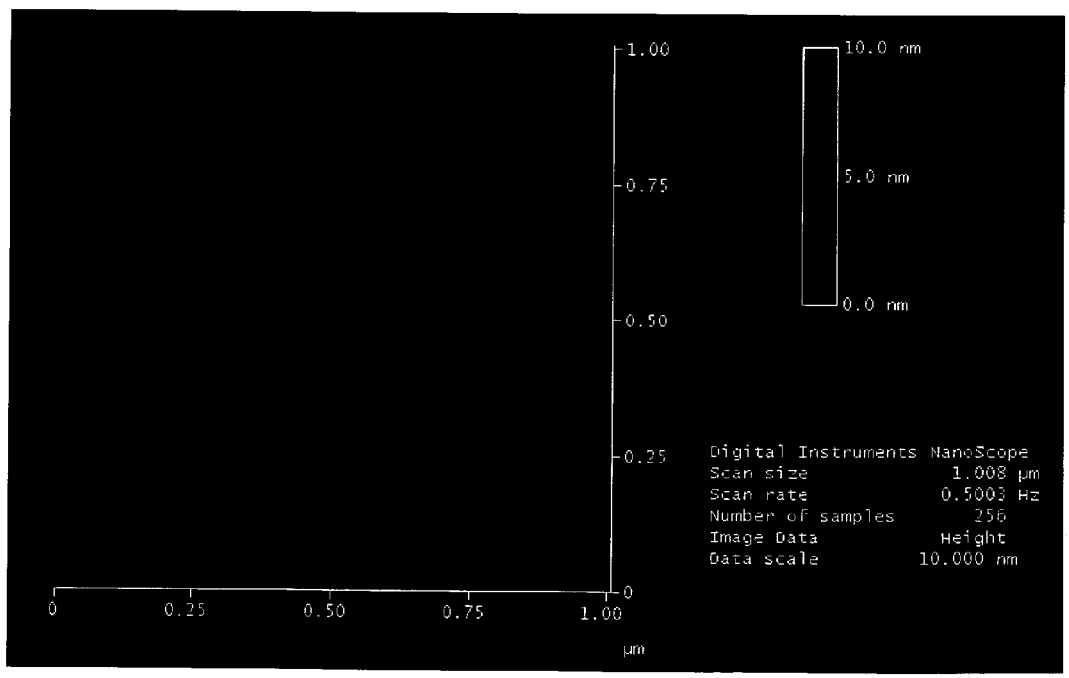

FIGS. 18 and 19 demonstrate the increase in the average grain size due to this annealing step. FIG. 18 shows atomic force microscopy images of a 200 nm thick gold film before (A) and after (B) separating the metal replica from the template substrate. In (A), the top (rough) surface was imaged. In (B), the templated (smooth) interface is imaged. To increase the grain size, a rapid thermal anneal (5 minutes at 500 degrees C.) was performed before separating the metal replica from the template substrate as describe in Example 9. This treatment was performed after the image in (A) was taken. Roughness parameters extracted from these samples are shown in Table 1 below. FIG. 19 shows atomic force microscopy images of a 250 nm thick silver film before (A) and after (B) separating the metal replica from the template substrate similarly as described in Example 9. The metal was thermally evaporated slowly onto a silicon wafer at 75 degrees C. In (A), the top (rough) surface is imaged. In (B), the replicated (smooth) interface is imaged. The grain size increased between (A) and (B) because the epoxy used to separate the film was thermally cured at 150 degrees C. for one hour. Roughness parameters extracted for these samples are shown in Table 1 below.

Example 10

This embodiment is similar to Example 9 except a sequence of deposition and annealing steps are performed to obtain a metal film that is substantially single crystal. After deposition the metal film is separated from the template substrate to obtain a smooth patterned metal replica that was substantially single crystal. For example, a standard silicon wafer with native oxide was patterned as in Example 9. Before metal deposition, the wafer was degreased with a detergent solution (Alconox in water, for example) and rinsed in deionized water, acetone, and methanol. The wafer was then placed into a high vacuum deposition chamber with a base pressure of about $1\times10^{-8}$ Torr, heated to 500 degrees C. Silver was deposited via sputtering at 0.057 nanometers per second until a thickness of 56 nanometers under an argon pressure of 6 milliTorr was deposited. Films were shown to be substantially single crystalline with a 200 outplane ordering, but were discontinuous. The resulting films were then cooled to room temperature (about 40 degrees C.) under high vacuum and then an additional 111.0 nanometers of silver were deposited via sputtering under 6 milliTorr of argon. (About 0.5 nanometers per second). After the second deposition step, the film was still discontinuous and no longer single crystal. The samples were then post annealed in high vacuum at 400 degrees C. to 500 degrees C. The time can vary, but a typical time was about 30 minutes. The resultant films were continuous, single crystal, and exhibited 200 outplane ordering. The patterned film was then removed from the template substrate as in Example 9 to obtain smooth, patterned, single crystal, metallic films.

Example 11

A roll-to-roll process is used in combination with the methods of making metal films described herein to obtain a continuous foil or polymer film that is coated with a smooth patterned metal film.

Example 12

Figure 20:
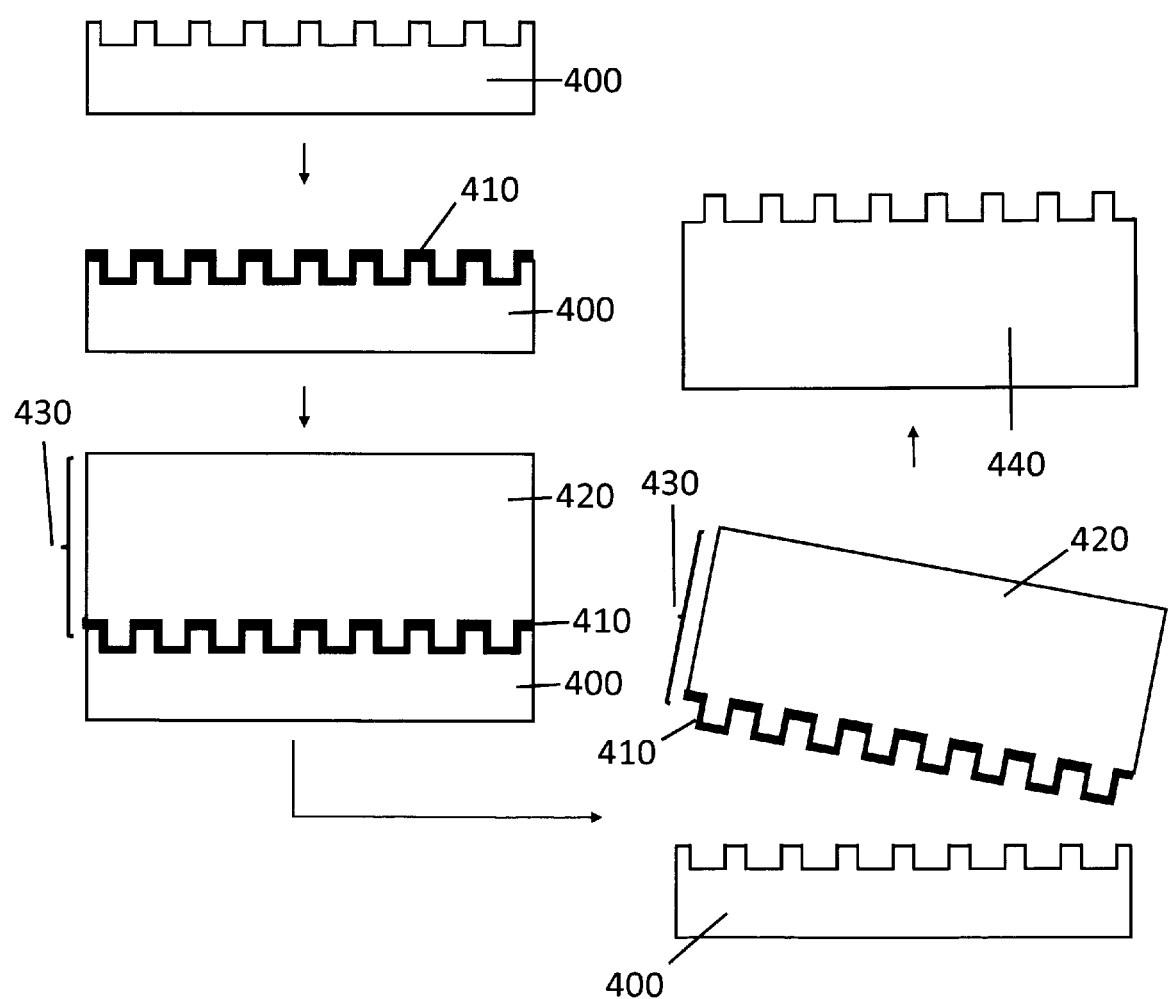
FIG. 20 is a schematic view of another exemplary method for replicating a patterned metal thin-film structure in accordance with the present invention.

Methods of making metal films in accordance with the present invention can be used with noble metals such as silver, gold, and copper. To use such methods with other materials, the process illustrated in FIG. 20 can be utilized. On a patterned silicon substrate 400, a thin metal layer 410, such as a gold, silver, or copper layer, is deposited via thermal evaporation or sputtering. Then desired material 420 is deposited on substrate 400 to form bilayer 430. Any desired deposition process such as sputtering, thermal evaporation, atomic layer deposition, chemical vapor deposition, electrodeposition, can be used. Because desired material 420 adheres better to metal layer 410 than metal layer 410 adheres to patterned silicon substrate 400, bilayer 430 can be separated from substrate 400 directly if desired material 420 is sufficiently thick or with epoxy as an adhesive layer as in Example 4. After removal, metal layer 410 can be removed via a selective chemical etching step to provide patterned film 440 of desired material. For example, this process can be used to obtain patterned tungsten and molybdenum films.

Example 13

Example 12 can also be used to obtain smooth patterned films that comprise plural layers. For example, after thermally evaporating a thin layer of silver (e.g., 30 nm at 0.1-0.2 nanometers per second) onto a clean patterned wafer, alternating layers of alumina (15 nm thick deposited at 0.01 nm/second) and silver (30 nm thick deposited at 0.5 nm/second) are sputtered onto the same substrate. After the desired numbers of layers are deposited, the entire film is separated directly or with epoxy as an adhesive layer. If additional metal is needed, an electrodeposited film is deposited and used to remove the entire multilayer film as in Example 5. The initial layer of metal (here silver) does not need to be chemically removed. This Example can be used as a simple approach to forming structured multilayer films. For example, a patterned film comprising a layer of silver, a layer of p-type silicon, a layer of n-type silicon, and a transparent conducing oxide, can be constructed as an inexpensive solar cell. The structure of the film can be used to enhance the absorption of sunlight through light trapping effects or minimization of reflection from the top surface. The metallic elements in the film can be used to enhance the absorption of sunlight through plasmonic concentration of light and the Purcell effect. A similar strategy could be used to obtain inexpensive and efficient light emitting diodes.

Example 14

Example 13 can also be adapted to other semiconductors and/or electrode materials for a variety of optoelectronic devices. For example, an evaporated metal layer such as 30 nm of copper 30 nm or 40 nm of aluminum can be followed by sputtering of doped/undoped silicon, or germanium, or II-VI semiconductors like CdSe, CdS, ZnSe, ZnS, followed by top layer or transparent conducting oxide like ITO. These layers can also be deposited on the patterned template in reverse order, such as copper, then ITO, then semiconductor, and then aluminum. The semiconductors and ITO can be deposited via sputtering at 5 mTorr base pressure, using 250 W of DC power in an Argon atmosphere. For ITO the gas flow rates are 19 sccm Argon and 1 sccm oxygen. For semiconductors (Si/Ge), the gas flow is 20 sccm of argon. II-VI semiconductors can be deposited either using chemical bath deposition or thermal evaporation. In general, such multilayers can be deposited and removed from the patterned template substrate as long as the individual layers adhere to each other better than the lowest layer (the layer next to the patterned template substrate) adheres to the template substrate.

Example 15

Examples 13 and 14 can include sacrificial layers that can be selectively removed by chemical etching. For example, if one of the layers is silica, this layer can be removed by immersing the film in hydrofluoric acid. This can lead to channels for microfluidic applications or other applications. If a silica layer is between two patterned tungsten, molybdenum, or tantalum layers, microfluidic channels can be obtained from refractory metals with high melting temperatures. Thus, microfluidic devices can be generated that are stable to high temperatures.

Example 16

Because noble metal atoms such as silver can be extremely mobile at elevated temperatures or even room temperature, methods to maintain desired surface features such as sharp tips, for example, can be used. In addition, some structures may require isolation from the surrounding environment when the patterned films or multilayers are heated to high temperature. For example, even under a controlled gas environment, oxidation of heated metals can change the surface properties. A general approach to protect patterned films in accordance with the present invention is to coat the patterned films with a thin layer of a thermally stable material, such as alumina. For example, silver concentric ring patterns as shown in FIG. 2C could be heated to 600 degrees C. without any apparent degradation of properties if these films were first coated with approximately 15 nm of alumina. These films were deposited as in Example 13.

Example 17

To fabricate an exemplary concentric ring structure in accordance with the present invention, the following exemplary procedure was used. Shipley 1805 positive tone resist was spin coated at 3500 rpm on a clean silicon substrate that had been sputtered with a 500 nm thick film of tungsten. Using standard photolithographic techniques, a concentric ring pattern was exposed through a Karl Suss Mask aligner using a chrome on glass mask. The exposed wafer was then developed in Microposit 351 developer (Rohm and Haas) for 30 seconds, rinsed with deionized water, and dried with nitrogen. The pattern was transferred into the tungsten by reactive ion etching with $SF_6$ and argon at 40 mtorr and 50 watts, using the photoresist as a protective layer. After transferring the pattern into the tungsten, the photoresist was removed by rinsing thoroughly in acetone, followed by immersion in Shipley 165 stripper at 65 degrees C. for more than two hours. The substrate was then rinsed with water and acetone, and dried in nitrogen. Other procedures consistent with microelectronics processing are contemplated and can be used such as described herein.

Example 18

A. Fabrication of Patterned Silicon Templates i. Using Focused Ion Beam (FIB)

Maskless lithography of the desired surface pattern was performed on smooth single-crystal silicon wafers using a dual-beam FEI Quanta 200 3D focused ion beam workstation. The patterns were etched using 30 kV as the acceleration voltage and 100 pA as the ion beam current. The patterned silicon wafers were then cleaned in a freshly prepared 1:1 solution (by volume) of sulfuric acid and hydrogen peroxide (piranha etch) for 5 minutes to remove any organic contamination.

ii. Using Optical Lithography

Single-crystal silicon wafers with the desired crystal orientation were coated with Shipley 1805 positive-tone photoresist using spin coating at 5000 rpm. Before exposure, the resist was baked at 105 degrees C. for 60 seconds. The desired pattern was then obtained by exposing the resist through a chrome-on-glass photomask using a Karl Suss MABA6 mask aligner. The exposed resist was developed for 30 seconds in a 17% solution (by volume) of Shipley 351 developer in water. The patterned wafer was coated with a thin layer of chromium or tungsten using sputtering or thermal evaporation and the wafer was placed in acetone under mild sonication for lift-off. The resulting patterned metal film was used as a mask for anisotropic KOH etching or reactive ion etching. For KOH etching, [100]-oriented silicon wafers were utilized.

To obtain the linear gratings in FIG. 11A, for example, the mask was patterned with lines oriented along [110] of the wafer. To obtain pyramidal divets for templating the structures in FIGS. 9C, 9D, and 9E, the mask was patterned with squares aligned along [110] or an array of circles aligned along [110]. These grooves or divets were obtained by anisotropic etching with the following procedure. After a 10 second soak in buffered oxide etchant to remove any native oxide layer, the wafer was immersed in a 25 wt % solution of KOH in water at 80 degrees C. The time varied depending on the exact pattern to be etched. For FIGS. 9C and 9D, the immersion time was 15 minutes. The wafers were then cleaned in deionized water for 30 minutes to remove any residual KOH. To remove the metal mask, CR-7S etchant (Cyantek corp.) or hydrogen peroxide were used for chromium and tungsten, respectively. Finally, the wafers were placed in piranha etch for 5 minutes as a final cleaning step before the deposition of metal in the replication process.

iii. Using Nanosphere Lithography

Nearly monodisperse 450 nm diameter polystyrene spheres were synthesized using the procedure set forth in B. T. Holland, C. F. Blanford, T. Do, A. Stein, Chem. Mater. 11, 795 (1999). A 20 weight % aqueous dispersion of these spheres was then spin-coated onto a clean silicon wafer to obtain a close-packed monolayer. After heating the wafer in an oven at 105 degrees C. for 30 minutes, the wafer was treated in an oxygen plasma using an STS etcher. This process shrunk the spheres while maintaining the center-to-center distance between nearest neighbors, which was set by the initial size of the colloidal spheres. Alumina or silica was then deposited to obtain a mask with holes via lift-off. This mask was used to transfer the hole-array pattern into the underlying single-crystal silicon wafer. Specifically, deep reactive ion etching (DRIE) was performed with a three-step Bosch process with a cycle that consisted of 5 seconds of passivation, 3 seconds of etching, and 7 seconds of patterning using $SF_6$, $C_4F_8$, and argon gases, 800 W for the coil power, and 15 W for the platen power. This cycle was repeated until the desired depth was achieved (typically about 2 μm). The etched templates were then cleaned for 2 minutes using a 1:1 solution (by volume) of ammonium hydroxide and hydrogen peroxide to eliminate a Teflon-like film. This was followed by an oxide etch to remove the dielectric mask. For example, silica was etched away by immersing for 1 minute in 5% aqueous hydrofluoric acid. Finally, the wafers were placed in piranha etch for 5 minutes as a final cleaning step before the deposition of metal in the template-stripping process.

B. Replication of Patterned Metal Films i. Metal Deposition

The patterned single-crystal silicon wafer could be coated with the desired metal (silver, gold, or copper) using thermal evaporation or sputtering. Typically, a thermal evaporator with a pressure of less than about $10^{-5}$ Torr was used with metal deposition rates from about 0.2-0.4 nm/second. In this case, the wafer was at room temperature. To produce the silver nanohole array in FIG. 12A, metal was thermally evaporated with near vertical deposition to obtain clean edges. For silver films, the roughness could be decreased further by heating the wafer during evaporation to 75 degrees C. and decreasing the deposition rate to 0.01-0.02 nm/second.

ii. Replication with Epoxy

A two-part epoxy was applied (or spin coated) to the deposited metal to form a removal layer of the desired thickness. Alternatively, the epoxy could be used as an adhesive layer to attach another substrate (silicon wafer or glass). Typically, either a 1:1 weight % mixture of a two-part epoxy (EPO-TEK 377, Epoxy Technologies) or a two-part quick-set epoxy (Loctite) is used. The epoxy could be cured thermally or with ultraviolet light. Typically, the sample was placed in an oven at 150 degrees C. for one hour. This had the added benefit of increasing the grain size, as shown in FIG. 19 and as described above. After curing, the epoxy was removed from the silicon template by using a razor blade to gently lift one edge and then peeling it off.

iii. Replication with Electrodeposited Films

After the patterned silicon templates were coated with a thin layer of evaporated metal (typically 200 nm thick), the templates were immersed in an electrolyte solution, along with a platinum wire as a counter electrode and lithium acetate as a reference electrode. Solutions of 1M $CuSO_4$ (pH 2 adjusted with $H_2SO_4$) and ammoniacal silver nitrate (pH 10 using $NH_4OH$) were used to electrodeposit copper and silver, respectively. After a sufficient thickness of metal was electrodeposited (greater than about 50 µm), the entire film could be separated from the silicon.

iv. Replication of Multilayer Films

Starting with any of the patterned silicon templates (concentric rings, grooves, bump arrays, pyramidal divets, and hole arrays), multilayer films could be obtained with replication in accordance with the present invention. Typically, about 30 nm of silver was thermally evaporated (at 0.1-0.2 nm/second) onto a clean patterned wafer. Alternating layers of alumina (15 nm thick deposited at 0.01 nm/second) and silver (30 nm thick deposited at 0.5 nm/second) were then deposited with an AJA sputterer. After the desired number of layers were formed, the film was removed using either epoxy or an electrodeposited film, as described above.

v. Thermal Annealing of Gold Films

To increase the grain size of gold films, the gold film were placed in a pre-heated oven at 500 degrees C. for 5 minutes. The oven was in a nitrogen-containing glove box and the sample was cooled to room temperature before the sample was brought into the ambient and separated in accordance with the present invention.

vi. Avoiding Sample Contamination

Due to concerns over the potential corrosion of silver films, especially due to sulfur compounds, samples were used immediately whenever possible. Samples were typically separated immediately prior to the measurements. If longer term storage was necessary, the samples were kept in a nitrogen-containing glove box.

C. Characterization i. X-Ray Photoelectron Spectroscopy (XPS)

Characterization of surface impurities was performed on a custom XPS spectrometer. The samples were thoroughly cleaned before the measurements to minimize any organic contamination and placed in a high vacuum chamber (base pressure about $10^{-9}$ Torr). The X-ray source (Mg, 1253.6 eV) was at an angle of 5 degrees from normal to the sample and the photoelectrons were detected at an angle of 54.7 degrees from normal (Phi 540 detector). 200 W (15 kV) was applied to the source and the signal was collected from the sample with no bias voltage applied. The analyzer pass energy for the survey scan was 89.45 eV and a higher resolution scan was done to determine the surface composition. The pass energy for the high resolution scan was 17.9 eV.

ii. Ellipsometry

To determine the dielectric function of metal films, a VASE spectroscopic ellipsometer (JA Woolam Co.) was utilized. With a 75 W xenon lamp source, the ratio of the polarized light reflected from the sample (s and p polarization) was determined. The stokes parameters $\Psi$ and $\Delta$ were then extracted using the equation, $$\rho = \frac{r_p}{r_s} = \tan(\Psi)e^{i\Delta}.$$

With WVASE software (JA Woolam Co.), the dielectric functions were fit using numerical iteration and the Fresnel equations. The measurements and fitting were performed for a wavelength interval of 1 nm and all the iterations were run to a mean square error less than 0.5. The wavelength range for the silver and gold films were 450 to 750 nm and 550 to 850 nm, respectively.

iii. Measurement of the Plasmon Propagation Length

The plasmon propagation lengths were measured for two films: (a) a 200 nm thick replicated smooth silver film on epoxy and (b) a 200 nm thick as-deposited rough silver film on a glass slide. Silicon could not be used as the control substrate because optical transparency was required. Both films had been evaporated onto the respective substrates at room temperature at a deposition rate of 0.2-0.4 nm/second. The root mean square roughnesses for these surfaces were approximately 0.7 and 5.0 nm, respectively. For each, multiple slit-groove pairs (like that shown in FIG. 10A) were milled into the film with focused ion beam. Both the slit and the groove were approximately 200 nm wide. Separation distances between the slit and groove were set at 10, 12, 15, 20, 25, 30, 35, and 40 µM. Each sample was then mounted on a Nikon TE 200 inverted microscope (40× objective, numerical aperture of 0.6) and illuminated on the epoxy or glass side in transmission mode with light from a quartz tungsten halogen lamp focused by a condenser (numerical aperture of 0.9). Surface plasmons were launched on the silver film when light passed through the slits. When these propagating plasmons struck the grooves, the plasmon scattered light that could be collected by the microscope objective. For each groove separately, was measured the image of the scattered light was projected onto the entrance of an imaging monochromator (TRIAX 320, Jobin Yvon) the spectrum with a liquid-nitrogen-cooled spectroscopic CCD camera (Princeton Instruments). Light that was transmitted directly through the slits in the sample was not allowed to enter the monochromator. Plots of the scattered intensity versus slit-groove separation distance for a particular wavelength were then used to extract the wavelength dependence of the surface plasmon propagation lengths.

iv. Atomic Force Microscopy (AFM)

All AFM images were obtained with a Veeco Nanoscope IIIA multimode system that was housed inside a nitrogen-containing glove box. The samples were scanned using tapping mode, typically over a 5×5 μm² area at a scan rate of 1 Hz. Nanoscope software was utilized to analyze the images and extract topographical information, including the root mean square (rms) surface roughness and the spectral density function (sdf).

v. Confocal Raman Microscopy

Confocal Raman scans were performed on a Witec Alpha 300R system equipped with an Omnichrome 514 nm argon-ion laser. The spectral range of the scan was between 0 and 4000 cm$^{-1}$ with a resolution of 0.02 cm$^{-1}$. The spatial resolution of the confocal system was 250 nm in the scanning plane and 500 nm in the perpendicular direction.

D. Analysis i. Experimental Surface Plasmon Propagation Lengths

For each wavelength, the scattered intensity versus slit-groove separation, d, was fitted to the following equation, $$I(x) = I_b + I_o e^{-x/L_{SPP}},$$

where $L_{SPP}$ is the surface plasmon propagation length, $I_o$ is the surface plasmon intensity at the slit, and $I_b$ is a background intensity. See J. T. van Wijngaarden et al., Appl. Phys. Lett. 88, 3 (2006). It is noted that that this is an underestimate of the surface plasmon propagation length because not all surface plasmons will propagate along the shortest path between the slit and groove. This angular dependence is ignored here because an exact treatment, which should include both the finite length of the slit-groove pair and knowledge of the angular dependence of the surface plasmon scattering, is not available. Approximate treatments lead to an overestimation of $L_{SPP}$.

A nonlinear regression analysis yielded an estimate of the surface plasmon propagation length with the standard errors shown in FIG. 10B. (The errors for the control film were smaller than the symbols used to plot the data and are therefore not shown.) Values for the expected propagation lengths were obtained by extracting the dielectric constants via ellipsometry for samples treated to the same conditions and inserting these into the following formulae, $$L_{SPP} = (2\mathrm{Im}(k_x))^{-1} = \frac{1}{2(\omega/c)} \left[ \mathrm{Im}\left( \sqrt{\frac{\varepsilon_{metal}}{1+\varepsilon_{metal}}} \right) \right]^{-1},$$

where $k_x$ is the in-plane wavevector of the surface plasmon along the direction of propagation. Note that these equations assume that the only loss mechanism for plasmon propagation is due to ohmic losses in the metal. (This is equivalent to $L_{ohm}$ below in Section Dii.

ii. Calculation of the Total Propagation Length $L_{tot}$

Surface plasmon propagation lengths due to in-plane scattering of surface plasmons, $L_{scat}$, and scattering of surface plasmons into radiation, $L_{rad}$, were estimated using the following equations, $$L_{scat} = \frac{2}{3} \frac{|\varepsilon'_{metal}|}{(\omega/c)^5} \frac{1}{\sigma^2 \delta^2}$$

$$L_{rad} = \frac{3}{4} \frac{|\varepsilon'_{metal}|^{1/2}}{(\omega/c)^5} \frac{1}{\sigma^2 \delta^2},$$

where $\varepsilon'_{metal}$ is the real part of the dielectric function of the metal, σ is the correlation length of the surface corrugation and δ is the root mean square height. Values for σ and δ were estimated from atomic force microscopy (AFM) measurements of the films. From an AFM scan, the power spectral density function (sdf) was determined and fit to a Gaussian. By plotting ln(sdf) versus the wavevector squared, σ and δ were extracted from the slope and peak value. See H. Raether, Surface Plasmons (Springer-Verlag, Berlin, 1988) and H. Shiba, M. Haraguchi, M. Fukui, J. Phys. Soc. Jpn. 63, 1400 (1994). for more details. The total propagation length was calculated using, $$\frac{1}{L_{tot}} = \frac{1}{L_{ohm}} + \frac{1}{L_{scat}} + \frac{1}{L_{rad}},$$

where $L_{ohm}$ is due to ohmic losses in the metal and $L_{tot}$ is the expected surface plasmon propagation length that includes ohmic losses in the metal, in-plane scattering of surface plasmons, and radiative scattering of surface plasmons. Such values are estimated in Table 2 based on the σ and δ parameters listed in Table 1.

When grain boundaries were considered (Table 3), the total propagation length was determined from, $$\frac{1}{L_{tot}} = \frac{1}{L_{ohm}} + \frac{1}{L_{scat}} + \frac{1}{L_{rad}} + \frac{1}{L_{gb}},$$

where $L_{gb}$ is the propagation length due to scattering of surface plasmons from grain boundaries. Next, $L_{gb}$ as $d_{gb}/S_{gb}$, were estimated where $d_{gb}$ is the average grain diameter and $S_{gb}$ is a scattering coefficient. $S_{gb}$ was set equal to 0.2% based on measurements in M. Kuttge et al., Appl. Phys. Lett. 93 (2008).

TABLE 1

Surface corrugation parameters, σ and δ, extracted from atomic force microscopy (AFM) images for different metal surfaces.

| Material | σ (nm) | δ (nm) | Measured root mean square roughness from AFM (nm) |
|---|---|---|---|
| Rough Silver | 179 | 6.56 | 4.7 |
| Smooth Silver | 52.9 | 0.941 | 0.36 |
| Rough Gold | 92.4 | 1.59 | 1.6 |
| Smooth Gold | 213 | 0.627 | 0.32 |

σ is the correlation length and δ is the root mean square height. Both can be estimated from a Gaussian fit to the spectral density function obtained from the AFM image. The rms roughness extracted directly from the AFM scan is shown for comparison. The four surfaces shown in FIGS. 18 and 19 were measured. These represent the rough (top) surface of a slow-evaporated 250 nm silver film, the smooth replicated interface from the same slow-evaporated silver film, the rough (top) surface of an evaporated 200 nm film of gold, and the smooth replicated interface from the same evaporated gold film. The smooth silver film was exposed to 1 hour at 150 degrees C. to cure the epoxy. The smooth gold sample was annealed for 5 minutes at 500 degrees C. prior to separation. Both of these heat treatments increased the grain size.

TABLE 2

Predicted propagation lengths based on experimental measurements of the dielectric function (ellipsometry) and the surface corrugation (atomic force microscopy) for the four different metal surfaces shown in FIGS. 18 and 19.

| Material | Wavelength | $L_{ohm}$ (μm) | $L_{scat}$ (μm) | $L_{rad}$ (μm) | $L_{tot}$ (μm) |
|---|---|---|---|---|---|
| Rough Silver | 488 nm | 7.47 | 10.2 | 4.19 | 2.12 |
|  | 514 nm | 10.8 | 15.4 | 5.87 | 3.05 |
|  | 532 nm | 13.5 | 20.2 | 7.33 | 3.85 |
|  | 632 nm | 33.7 | 75.2 | 21.7 | 11.2 |
| Smooth Silver | 488 nm | 15.7 | $6.78 \times 10^3$ | $2.56 \times 10^3$ | 15.6 |
|  | 514 nm | 22.1 | $1.03 \times 10^4$ | $3.58 \times 10^3$ | 21.9 |
|  | 532 nm | 26.0 | $1.34 \times 10^4$ | $4.46 \times 10^3$ | 25.8 |
|  | 632 nm | 54.1 | $4.94 \times 10^4$ | $1.32 \times 10^4$ | 53.8 |
| Rough Gold | 632 nm | 10.5 | 427 | 139 | 9.52 |
| Smooth Gold | 632 nm | 11.8 | $4.72 \times 10^3$ | $1.52 \times 10^3$ | 11.7 |

We used formulas above to determine: (i) $L_{ohm}$, due to ohmic loss in the metal, (ii) $L_{scat}$, due to in-plane scattering of the surface plasmons, (iii) $L_{rad}$, due to radiative scattering of the surface plasmons, and (iv) $L_{tot}$, the total effect of all of these loss channels. Note that the values obtained for the rough silver film are estimates due to the questionable validity of the single scattering approximation and potential complications in ellipsometry due to the rough interface. For $L_{scat}$ and $L_{rad}$, the values of σ and δ listed in Table 1 were used.

TABLE 3

Predicted propagation lengths as in Table 2.

| Material | Wavelength | $L_{ohm}$ (μm) | $L_{scat}$ (μm) | $L_{rad}$ (μm) | $L_{gb}$ (μm) | $L_{tot}$ (μm) |
|---|---|---|---|---|---|---|
| Rough Gold | 632 nm | 10.5 | $4.27 \times 10^2$ | $1.39 \times 10^2$ | 40.0 | 7.69 |
|  | 700 nm | 27.7 | $1.02 \times 10^3$ | $2.77 \times 10^2$ | 40.0 | 15.2 |
|  | 800 nm | 57.0 | $2.91 \times 10^3$ | $6.56 \times 10^2$ | 40.0 | 22.5 |
| Smooth Gold | 632 nm | 11.8 | $4.72 \times 10^3$ | $1.52 \times 10^3$ | $5.00 \times 10^2$ | 11.4 |
|  | 700 nm | 32.2 | $1.13 \times 10^4$ | $3.02 \times 10^3$ | $5.00 \times 10^2$ | 29.9 |
|  | 800 nm | 66.0 | $3.22 \times 10^4$ | $7.15 \times 10^3$ | $5.00 \times 10^2$ | 57.7 |

In addition to $L_{ohm}$, $L_{scat}$, and $L_{rad}$, the propagation length due to surface plasmon scattering at grain boundaries, $L_{gb}$, was included. $L_{gb}$ as $d_{gb}/S_{gb}$, were estimated where $d_{gb}$ is the average grain diameter and $S_{gb}$ is a scattering coefficient. $S_{gb}$ was set equal to 0.2% as explained above. $L_{tot}$ is the total effect of all of the loss channels. Values for the two gold surfaces in FIG. 18 are shown. For $L_{scat}$ and $L_{rad}$ the values of σ and δ listed in Table 1 were used.

Devices and methods in accordance with the present invention are also described in:

1) Commonly owned U.S. Provisional Application No. 61/200,201, to Norris et al., entitled "Creation of Light and/or Surface Plasmons with Heated Metallic Films," filed on 25 Nov. 2008;
2) Commonly owned U.S. Provisional Patent Application No. 61/142,316, to Norris et al., entitled "Creation of Light and/or Surface Plasmons with Heated Metallic Films," filed on 2 Jan. 2009; and
3) Commonly owned U.S. Provisional Patent Application No. 61/215,056, to Norris et al., entitled "Creation of Light and/or Surface Plasmons with Heated Metallic Films," filed on 1 May 2009, the entire contents of which are each incorporated herein by reference for all purposes.

The present invention has now been described with reference to several exemplary embodiments thereof. The entire disclosure of any patent or patent application identified herein is hereby incorporated by reference for all purposes. The foregoing disclosure has been provided for clarity of understanding by those skilled in the art. No unnecessary limitations should be taken from the foregoing disclosure. It will be apparent to those skilled in the art that changes can be made in the exemplary embodiments described herein without departing from the scope of the present invention. Thus, the scope of the present invention should not be limited to the exemplary structures and methods described herein, but only by the structures and methods described by the language of the claims and the equivalents of those claimed structures and methods.

What is claimed is:

1. A method of creating an optical beam, the method comprising: providing a metal film comprising one or more periodically distributed surface feature; heating the metal film; creating surface plasmons at the surface of the metal film; and generating an optical signal.

2. The method of claim 1, wherein at least a portion of the one or more periodically distributed surface feature comprises at least one of one or more arcuate channel, one or more linear channel, and one or more angular channel.

3. The method of claim 1, comprising generating an optical signal comprising a beam having a spectral linewidth (full width at half maximum) from about 0.1 nm to about 50 nm and an angular linewidth (full width at half maximum) from about 0.01 degrees to about 0.1 degrees.

4. The method of claim 1, comprising generating an optical signal comprising a beam having a wavelength of about 0.5 microns to 3.5 microns.

5. The method of claim 1, comprising mounting the film on a heating device that comprises a resistive heater that is heated by electrical current.

6. The method of claim 1, comprising resistively heating the metal film by running electrical current through the metal film.

7. A patterned device comprising: a metal film comprising one or more periodically distributed surface feature configured to create surface plasmons and emit an optical signal when heated; and a heating device configured to heat the metal film.

8. The patterned device of claim 7, wherein at least a portion of the one or more periodically distributed surface feature comprises a plurality of arcuate channels.

9. The patterned device of claim 7, wherein the metal film comprises continuous non-perforated layer.

* * * * *

UNITED STATES PATENT AND TRADEMARK OFFICE
CERTIFICATE OF CORRECTION

| | |
|---|---|
| PATENT NO. | : 8,948,562 B2 |
| APPLICATION NO. | : 13/131197 |
| DATED | : February 3, 2015 |
| INVENTOR(S) | : David J. Norris et al. |

It is certified that error appears in the above-identified patent and that said Letters Patent is hereby corrected as shown below:

Column 1
Lines 16-20 "This work was supported by the U.S. Department of Energy (DE-FG02-06ER46438) and was also funded by NSF through the NNIN program and was also funded by an NIH Biotechnology Training Grant (T32-GM008347). The US Government may have certain rights to the invention."

should be -- This invention was made with government support under DE-FG02-06ER46348 awarded by the Dept. of Energy and the NNIN program awarded by the National Science Foundation. The government has certain rights in the invention. --

Signed and Sealed this
Eighth Day of December, 2015

Michelle K. Lee
*Director of the United States Patent and Trademark Office*